United States Patent
Liaw

(10) Patent No.: US 9,425,201 B2
(45) Date of Patent: Aug. 23, 2016

(54) CELL LAYOUT FOR SRAM FINFET TRANSISTORS

(71) Applicant: Taiwan Semiconductor Manufacturing Company, Ltd., Hsin-Chu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/671,568

(22) Filed: Mar. 27, 2015

(65) Prior Publication Data

US 2015/0206890 A1    Jul. 23, 2015

Related U.S. Application Data

(62) Division of application No. 13/788,954, filed on Mar. 7, 2013, now Pat. No. 9,012,287.

(60) Provisional application No. 61/726,425, filed on Nov. 14, 2012.

(51) Int. Cl.
*H01L 21/00* (2006.01)
*H01L 27/11* (2006.01)
(Continued)

(52) U.S. Cl.
CPC ... *H01L 27/1108* (2013.01); *H01L 21/823821* (2013.01); *H01L 21/845* (2013.01);
(Continued)

(58) Field of Classification Search
CPC . H01L 21/823; H01L 21/821; H01L 21/845; H01L 27/1108; H01L 27/0207; H01L 27/0924; H01L 27/1104; H01L 27/1211; H01L 29/0657; H01L 29/6681; H01L 29/785
See application file for complete search history.

(56) References Cited

U.S. PATENT DOCUMENTS

2006/0038234 A1    2/2006  Liaw
2008/0308848 A1*  12/2008  Inaba ............... G11C 11/412
                                                     257/255

(Continued)

FOREIGN PATENT DOCUMENTS

JP    2008288272    11/2008
KR    20110092299    8/2011

OTHER PUBLICATIONS

Kedzierski, Jakub, et al., "Extension and Source/Drain Design for High-Performance FinFET Devices," IEEE Transactions on Electron Devices, vol. 50, No. 4, Apr. 2003, pp. 952-959.

*Primary Examiner* — Whitney T Moore
*Assistant Examiner* — Joseph Galvin, III
(74) *Attorney, Agent, or Firm* — Slater Matsil, LLP

(57) ABSTRACT

An SRAM array and method of making is disclosed. Each SRAM cell comprises two pull-up (PU), two pass-gate (PG), and two pull-down (PD) FinFETs. The PU transistors are adjacent to each other and include one active fin having a first fin width. Each PG transistor shares at least one active fin with a PD transistor. The active fin shared by a PG and a PD transistor has a second fin width smaller than the first fin width. The method includes patterning a plurality of fins including active fins and dummy fins and patterning and removing at least a portion of the dummy fins. No dummy fin is disposed between PU FinFETs in a memory cell. One dummy fin is disposed between a PU FinFET and the at least one active fin shared by a PG and a PD transistor. At least one dummy fin is disposed between adjacent memory cells.

20 Claims, 22 Drawing Sheets

(51) Int. Cl.
*H01L 27/02* (2006.01)
*H01L 21/8238* (2006.01)
*H01L 21/84* (2006.01)
*H01L 29/66* (2006.01)
*H01L 27/092* (2006.01)
*H01L 27/12* (2006.01)
*H01L 29/06* (2006.01)
*H01L 29/78* (2006.01)
*H01L 21/8234* (2006.01)

(52) U.S. Cl.
CPC ....... *H01L27/0207* (2013.01); *H01L 27/0924* (2013.01); *H01L 27/1104* (2013.01); *H01L 27/1211* (2013.01); *H01L 29/0657* (2013.01); *H01L 29/6681* (2013.01); *H01L 29/785* (2013.01); *H01L 21/823431* (2013.01)

(56) References Cited

U.S. PATENT DOCUMENTS

| 2010/0109086 | A1* | 5/2010 | Song | H01L 29/785 257/365 |
| 2011/0133285 | A1 | 6/2011 | Liaw | |
| 2012/0299106 | A1 | 11/2012 | Mann | |
| 2013/0181297 | A1* | 7/2013 | Liaw | G11C 11/412 257/390 |
| 2013/0277760 | A1 | 10/2013 | Lu et al. | |
| 2013/0309838 | A1* | 11/2013 | Wei | H01L 21/76229 438/424 |

* cited by examiner

CELL LAYOUT FOR SRAM FINFET TRANSISTORS

This application claims priority to U.S. patent application Ser. No. 13/788,954, filed on Mar. 7, 2013, entitled "Cell Layout for SRAM FinFET Transistors," which claims priority to U.S. Provisional Application Ser. No. 61/726,425, filed on Nov. 14, 2012, entitled "Cell Layout for SRAM FinFET Transistors," which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

In a complementary metal oxide semiconductor (CMOS), active regions include a drain, a source, a channel region connected between the drain and the source, and a gate on top of the channel to control the on and off state of the channel region. When the gate voltage is more than a threshold voltage, a conductive channel is established between the drain and the source. As a result, electrons or holes are allowed to move between the drain and source. On the other hand, when the gate voltage is less than the threshold voltage, the channel is cut off and there are no electrons or holes flowing between the drain and the source. However, as semiconductor devices keep shrinking, due to the short channel leakage effect, the gate cannot fully control the channel region, especially a further portion of the channel region to cut off the electron/hole flow. As a consequence, after semiconductor devices are scaled into deep sub-30 nanometer dimensions, the corresponding short gate length of conventional planar transistors may lead to the inability of the gate to substantially turn off the channel region.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. An effective gate length is increased in the same area as the active region becomes three-dimensional. The short channel leakage effect of conventional planar transistors has been reduced for the same size transistor and less leakage current results. The incorporation of FinFET structures into various devices and structures, such as different types of memory cells, brings additional challenges as increases in memory cell density and stability continues to be sought.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 4A and 4B 11 are layouts of fins in an SRAM unit cell according to an embodiment;

FIG. 5B is a cross section diagram from cut lines B-B' of FIG. 4B;

Corresponding numerals and symbols in the different figures generally refer to corresponding parts unless otherwise indicated. The figures are drawn to clearly show the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a static random-access memory (SRAM) formed of fin field effect transistors (FinFETs). The embodiments of the disclosure may also be applied, however, to a variety of semiconductor devices. Various embodiments will be explained in detail with reference to the accompanying drawings.

Figure 1:
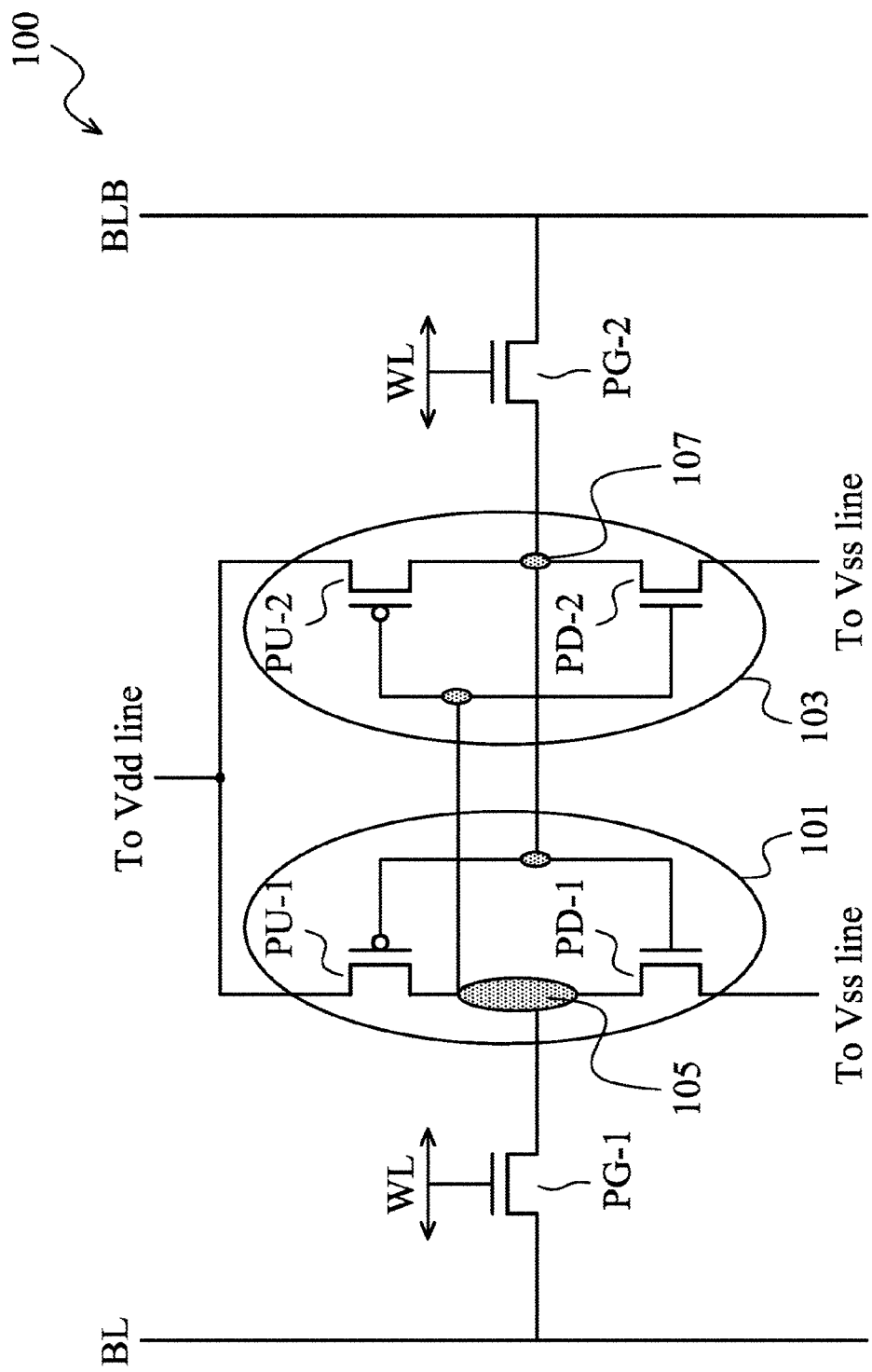
FIG. 1 is a circuit diagram of a six transistor (6T) SRAM cell according to various embodiments.

Static random-access memory (SRAM) is a type of volatile semiconductor memory that uses bistable latching circuitry to store each bit. Each bit in an SRAM is stored on four transistors (PU-1, PU-2, PD-1, and PD-2) that form two cross-coupled inverters. This memory cell has two stable states which are used to denote 0 and 1. Two additional access transistors (PG-1 and PG-2) serve to control the access to a storage cell during read and write operations. A typical SRAM uses six MOSFETs to store each memory bit. FIG. 1 is a circuit diagram of a six transistor (6T) SRAM cell. The SRAM cell 100 comprises a first inverter 101 formed by a pull-up p-type metal oxide semiconductor (PMOS) transistor PU-1 and a pull-down n-type metal oxide semiconductor (NMOS) transistor PD-1. The SRAM cell 100 further comprises a second inverter 103 formed by a pull-up PMOS transistor PU-2 and a pull-down NMOS transistor PD-2. Furthermore, both the first inverter and second inverter are coupled between a voltage bus Vdd and a ground potential Vss.

As shown in FIG. 1, the first inverter 101 and the second inverter 103 are cross-coupled. That is, the first inverter 101 has an input connected to the output of the second inverter 103. Likewise, the second inverter 103 has an input connected to the output of the first inverter 101. The output of the first inverter is referred to as a storage node SN 105. Likewise, the output of the second inverter is referred to as a storage node SNB 107. In a normal operating mode, the storage node SN 105 is in the opposite logic state as the storage node SNB 107. By employing the two cross-coupled inverters, the SRAM cell 100 can hold the data using a latched structure so that the stored data will not be lost without applying a refresh cycle as long as power is supplied through Vdd.

In an SRAM array (not shown) using the 6T SRAM cells, the cells are arranged in rows and columns. The columns of the SRAM array are formed by a bit line pairs, namely a first bit line BL and a second bit line BLB. The cells of the SRAM array are disposed between the respective bit line pairs. As shown in FIG. 1, the SRAM cell 100 is placed between the bit line BL and the bit line BLB.

As shown in FIG. 1, the SRAM cell 100 further comprises a first pass-gate transistor PG-1 connected between the bit line BL and the output 105 of the first inverter. The SRAM cell 100 further comprises a second pass-gate transistor PG-2 connected between the bit line BLB and the output 107 of the second inverter. The gates of the first pass-gate transistor PG-1 and the second pass-gate transistor PG-2 are connected to a word line (WL), which connects SRAM cells in a row of the SRAM array.

In operation, if the pass-gate transistors PG-1 and PG-2 are inactive, the SRAM cell 100 will maintain the complementary values at storage nodes SN and SNB indefinitely as long as power is provided through Vdd. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

During a WRITE operation, bit lines BL and BLB are set to opposite logic values according to the new data that will be written into the SRAM cell 100. For example, in an SRAM write operation, a logic state "1" stored in a data latch of the SRAM cell 100 can be reset by setting BL to "0" and BLB to "1". In response to a binary code from a row decoder (not shown), a word line coupled to the pass-gate transistors PG-1 and PG-2 of the SRAM cell 100 is asserted to select the memory cell and turn on PG-1 and PG-2. As a result, the storage nodes SN and SNB are connected to BL and BLB respectively. Furthermore, the storage node SN of the data latch is discharged by BL to "0" and the other storage node of the data latch is charged by BLB to "1". As a result, the new data logic "0" is latched into the SRAM cell 100.

In a READ operation, both BL and BLB of the SRAM cell 100 are pre-charged to a voltage approximately equal to the operating voltage of the memory bank in which the SRAM cell 100 is located. In response to a binary code from the row decoder, a word line coupled to the first pass-gate PG-1 and the second pass-gate PG-2 of the SRAM cell 100 is asserted so that the data latch is selected to proceed to a READ operation.

During a READ operation, through a turned on pass-gate transistors PG-1 and PG-2, one bit line coupled to the storage node storing a logic "0" is discharged to a lower voltage. Meanwhile, the other bit line remains the pre-charged voltage because there is no discharging path between the other bit line and the storage node storing a logic "1". The differential voltage between BL and BLB (approximately in a range from 50 to 100 mV) is detected by a sense amplifier (not shown). Furthermore, the sense amplifier amplifies the differential voltage and reports the logic state of the memory cell via a data buffer.

Figure 2:
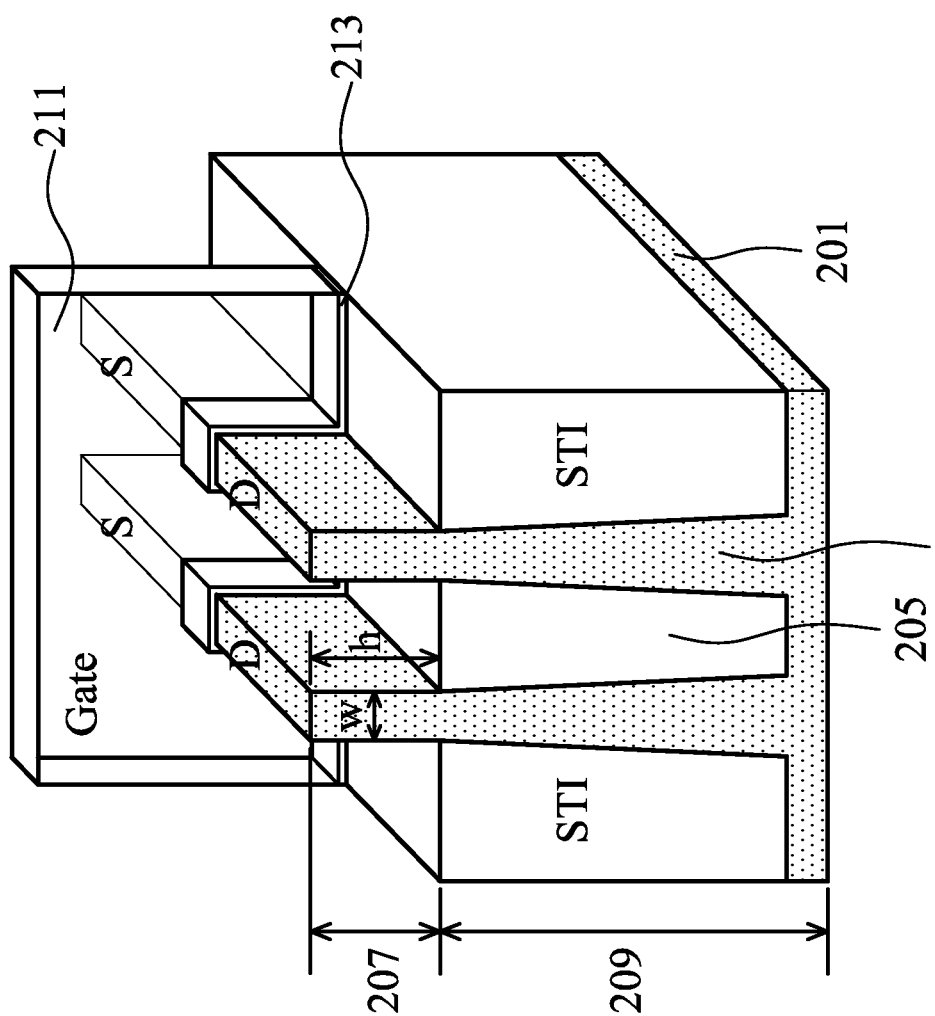
FIG. 2 illustrates in perspective view a FinFET transistor in accordance with an embodiment.

In the circuit diagram of FIG. 1, transistors PU-1, PU-2 are p-type transistors. Transistors PD-1, PD-2, PG-1, and PG-2 are n-type transistors. According to various embodiments, transistors PU-1, PU-2, PD-1, PD-2, PG-1 and PG-2 are implemented by FinFETs. FinFETs use a substantially rectangular fin structure formed generally in one of two ways. In one method, shallow trench isolation (STI) features 205 are formed first on bulk silicon material, shown in FIG. 2 as substrate 201. The bottoms of the trenches between the STI features are exposed bulk silicon. Silicon is then grown in the trenches to form fins 203 by using, for example, an epitaxial process. Once a desired fin height is reached, then the STI 205 is etched to a level below the top of the fin to expose a top portion of the fin. The exposed portion of the fin is a top portion 207 and the embedded portion is a bottom portion 209. The bulk silicon material 201 may be a silicon substrate or a deposited silicon such as silicon-on-insulator (SOI) with a barrier oxide (BOX) layer between the SOI and the underlying silicon substrate. Using this method, the STI features define the size and shape of the fins. Depending on etch parameters used when the trenches are formed, the fins may have a variety of substantially rectangular shapes, including the slight angle at the bottom portion of the fin as shown in FIG. 2.

In another method, bulk silicon on a substrate is etched into a rectangular fin shape by first patterning and depositing a hardmask layer on the bulk silicon. The hardmask forms a pattern covering the bulk silicon. The bulk silicon is then etched to form trenches between the regions covered by the hardmask layer. The trenches are formed into shallow trench isolation (STI) features 205 by depositing a dielectric material, usually silicon oxide. The dielectric material is usually deposited in excess to completely cover the fins 203 and optionally the hardmask layer if not yet removed. The dielectric material is planarized down to the top surface of the fin/hardmask, and then etched to a level below the top of the fin so that a portion of the fin protrudes above the STI. The protruded fin portion is a top portion 207 and the embedded fin portion is a bottom portion 209.

The hardmask for etching the fin may be formed by patterning directly from a photoresist or by a process using mandrels. The direct patterning method produces fin sizes that are limited by the lithographic processes used to pattern the photoresist. Advanced lithographic techniques using extreme ultra-violet (EUV) radiation having a wavelength between about 10 nm and 120 nm can directly print fin patterns on hardmasks for etching into bulk silicon.

Small fin sizes may also be produced using a spacer scheme in combination with lithographic processes using longer wavelength radiation, such argon fluoride (ArF)

producing radiation at 193 nm. Using the spacer scheme, a photoresist pattern is formed and used to etch a mandrel pattern. A conformal spacer material is then deposited around the mandrel. The conformal spacer is usually formed of a hardmask material forming a spacer sidewall thinner than that of the mandrel. The mandrel material between the spacers is then removed in subsequent etching operations to leave just the spacers behind. Some of the spacers are then used as a hardmask for etching the underlying silicon layers to form the fin structures. Using the mandrel/spacer method, thinner fins that are closer together can be formed than direct patterning of the hardmask using a photoresist. The exposed fin portions 207 have a height dimension (h), a width dimension (w) and a length dimension (l). Some electrical properties of the FinFET can be defined relative to these dimensions. For example, an effective channel width for the transistor may be calculated using the dimension of the fins under the gate. As shown in FIG. 2, the effective channel width is 2 fins, or 2×(2h+w). The fin width dimension affects subthreshold swing degradation and drain-induced barrier lowering (DIBL) that determines the Ion-Ioff ratio. Thus improved control of fin critical dimensions and etch profiles can improve cell stability and performance.

The substrate etch to form the fins is susceptible to loading effects between isolated and dense patterns. In other words, a differing density results in different fin line profile including both critical dimensions and sidewall profile angle. One solution is to use equally spaced fin lines formed at a maximum density (minimum spacing according to a design rule) to ensure uniformity during etching. Additional lithography and etch steps are performed to remove some of the fins, referred to as dummy fins. However, this solution adds dummy fins between all transistors in a memory cell and limits the shrink in cell size because a minimum distance of two fin pitches is used.

The remaining FinFET forming process steps are described here to provide context for the present disclosure. A gate dielectric layer 213 and gate electrode layer 211 are deposited over the fins and the STI layer. Gate dielectric layer 213 is formed of a high dielectric constant (high-k) dielectric material. The exemplary high-k materials may have k values greater than about 4.0, or even greater than about 7.0, and may include aluminum-containing dielectrics such as $Al_2O_3$, HfAlO, HfAlON, or AlZrO; Hf-containing materials such as $HfO_2$, $HfSiO_x$, $HfAlO_x$, $HfZrSiO_x$, or HfSiON; and/or other materials such as $LaAlO_3$ or $ZrO_2$. Gate electrode layer 211 is formed on the gate dielectric layer 213, and may be formed of a conductive material such as doped polysilicon, metals, or metal nitrides.

The gate electrode layer 211 and gate dielectric layer 213 are then patterned to form gate stacks over a middle portion of the fins. The fin portions not under the gate stacks are then optionally doped to form lightly doped drain and source (LDD) regions. The dopant used depends on the conductivity type of the transistor. The LDD regions may be doped by ion-implanting or by plasma doping where dopants are deposited onto the fin and annealed. Source and drain regions are formed across the gate stack. Source and drain regions may be formed by ion-implanting a source/drain region or by removing a portion of the fin and epitaxially re-growing the removed portion under doping conditions to form a source/drain region.

According to various embodiments, the present disclosure allows memory cell size reduction while taking into account the loading effects by creating different fin formation environments for n-type and p-type FinFETs. As noted, a typical 6T SRAM includes two PMOS FinFETs (PU-1 and PU-2) and four NMOS FinFETs (PD-1, PD-2, PG-1, and PG-2). Dummy fin lines are provided for the NMOS FinFETs and no dummy fin line is provided for the PMOS FinFETs during fin line formation. The dummy fin lines for the NMOS FinFETs ensure uniform etching for the fins in the NMOS FinFETs and are then completely or partially removed in subsequent operations. Not providing the dummy fin lines for the PMOS FinFETs allows the PMOS FinFETs to be placed closer together, closer than the two times fin pitch, than the NMOS FinFETs. The closer placement reduces the memory cell size. Memory cell stability is maintained because the dense fin line environment for the NMOS FinFETs minimize localized effects and produce active fins with a more vertical fin profile and narrower fin width. The more vertical fin profile and narrower fin width reduce adverse effects of subthreshold swing and drain-induced barrier lowering (DIBL). As result, the memory cell has a lower minimum Vcc performance, better N/P ion ratio for PD to PU and better beta ratio for PD to PG.

Figure 3A:
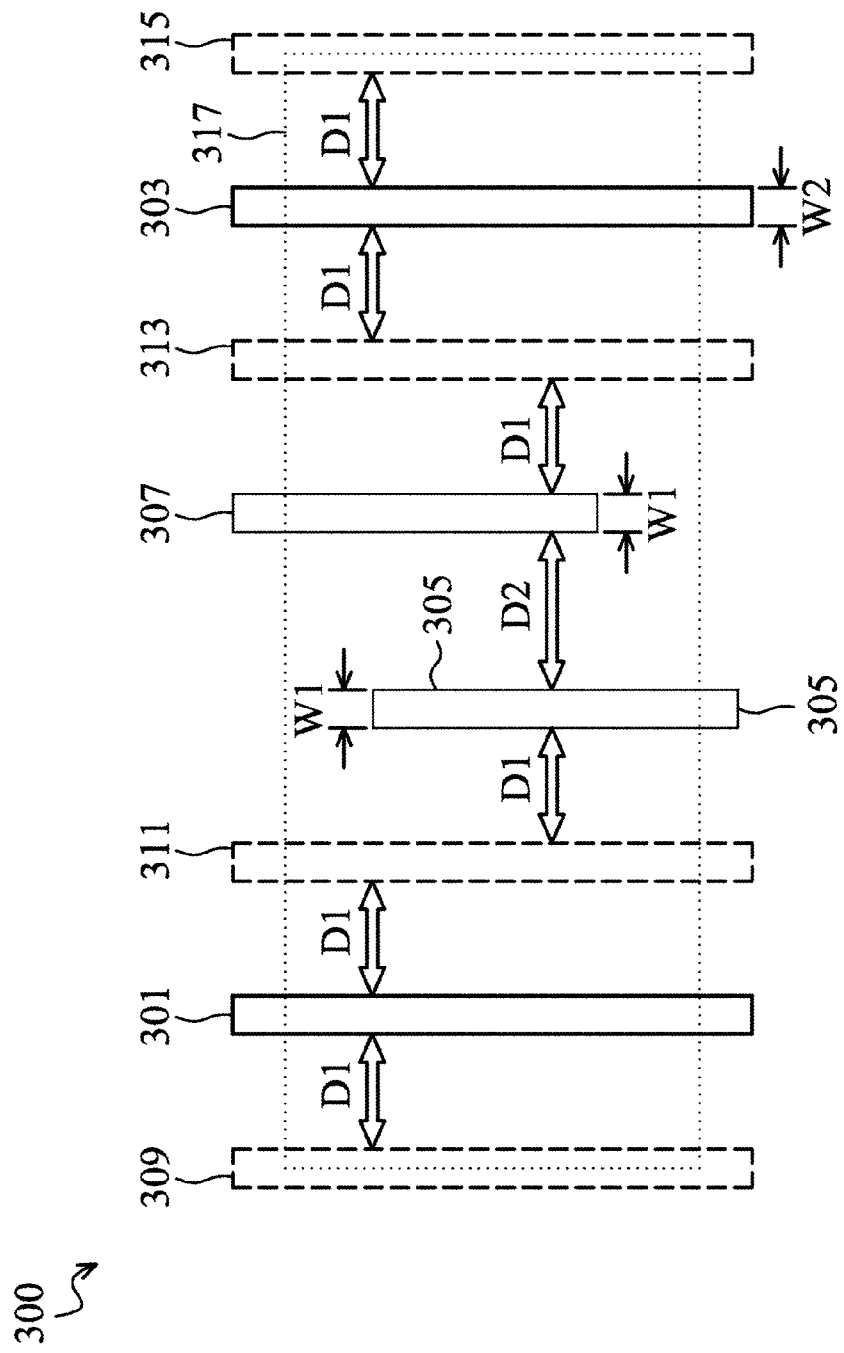
FIGS. 3A and 3B are layouts of fins in an SRAM cell in accordance with various embodiments.
Figure 3B:
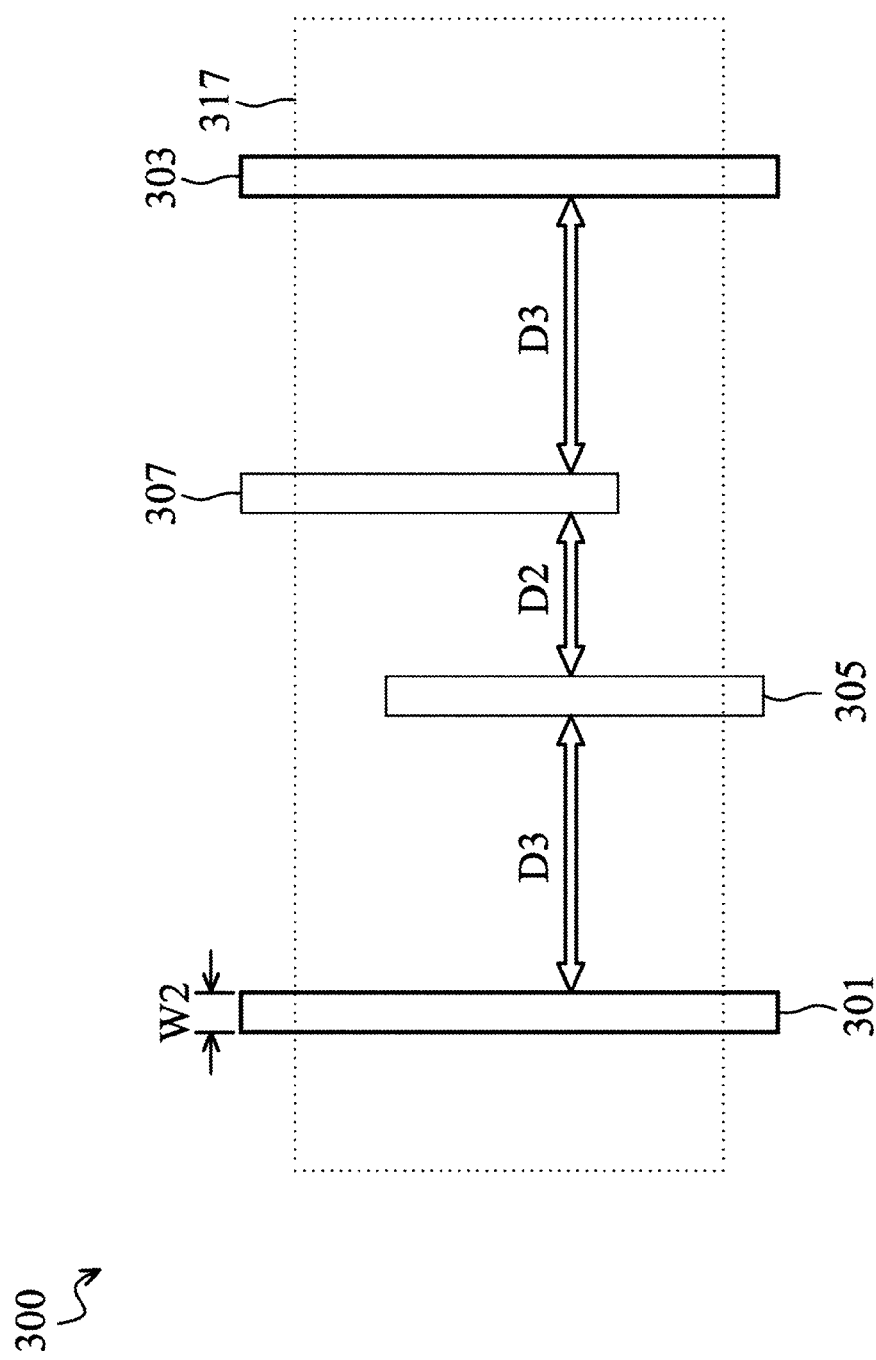

FIGS. 3A and 3B are layouts of fins in an SRAM cell 300 in accordance with various embodiments. As shown in FIG. 3A, the SRAM 300 includes four active fins 301, 303, 305, and 307 and four dummy fins 309, 311, 313, and 315. The active fins are divided into two groups having different fin widths and distances. Fins 301 and 303 have a width W2 and are a distance D1 from their nearest adjacent fin. Fins 305 and 307 have a width W1 and are a distance D2 from each other and a distance D1 from their nearest dummy fins, which are 311 and 313. Fins 305 and 307 are also shorter than the dummy fins and the other active fins. Boundary 317 denotes the active region for the memory cell 300. Dummy fins 309 and 315 are disposed on the edges of the memory cell boundary 317. Distance D1 may correspond to a minimum space between elongated features as dictated by the lithographic process used. When features are spaced apart at using the minimum space, the feature density is at a maximum and the area may be referred to as a dense area. Distance D2 is longer than distance D1; thus fins 305 and 307 are more isolated from each other than their other neighboring fins. Because the distance D1 and D2 are different, when the fins are etched in bulk silicon, the difference in feature density causes different fin widths and fin shapes to form. Dense features form narrower fins with steeper sidewalls. Less dense features form wider fins with sidewalls that are less perpendicular. Thus, fin width W2 is narrower than fin width W1. According to various embodiments, a ratio of W2 over W1 may be between about 0.6 and about 0.9. The sidewalls of fins 305 and 307 are less steep than the sidewalls of fins 301 and 303.

FIG. 3B shows the fin layout after the dummy fins are removed from FIG. 3A, with only active fins remaining. The active fins 301 and 303 are a distance D3 from the nearest active fins 305 and 307 in the same cell. The distance D3 is two times distance D1 plus a fin width W2. The distance D3 is larger than distance D2.

Figure 3C:
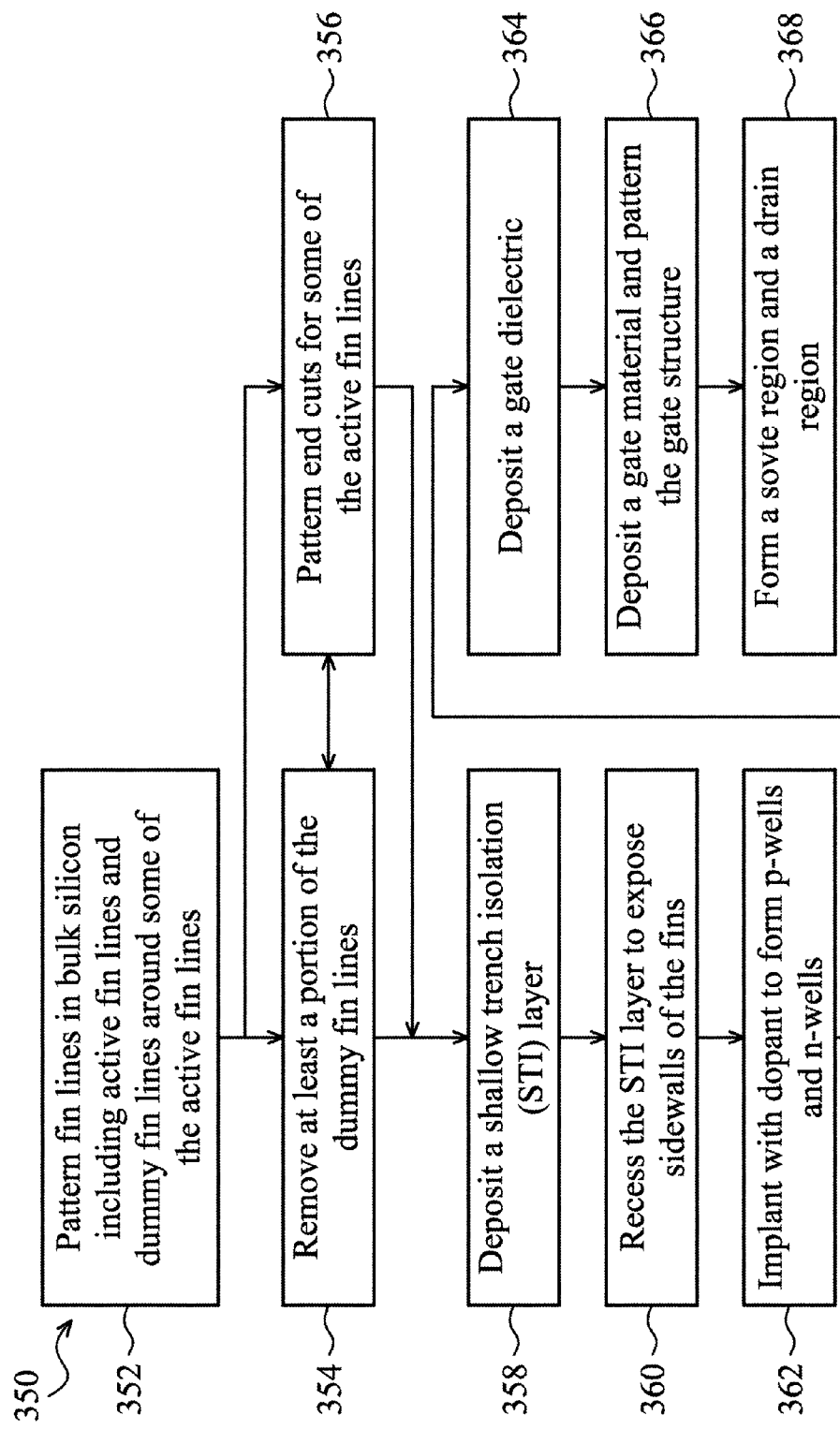
FIG. 3C is a flow chart illustrating an exemplary method embodiment.
Figure 4A:
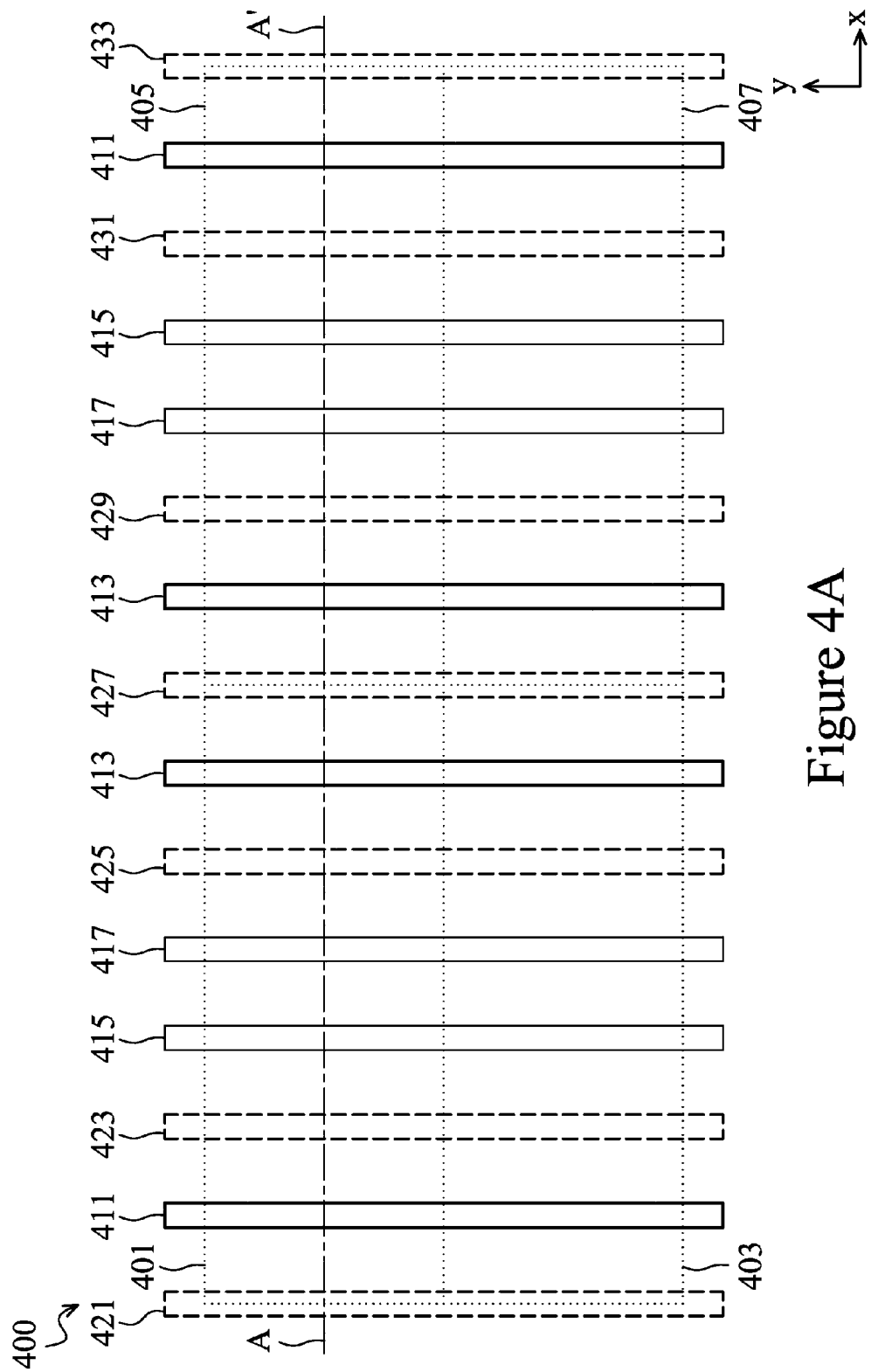

FIG. 3C is a flow diagram of method embodiments for fabricating the SRAM cell according to various aspects of the present disclosure. A partially fabricated SRAM cell has fins corresponding to the fin layout diagram of FIG. 3A after operations 352 and 356. A partially fabricated SRAM cell has fins corresponding to the fin layout diagram of FIG. 3B after operations 352, 354, and 356. In operation 352 fin lines are patterned in bulk silicon. The fin lines include active fin lines and dummy fin lines around some of the active fin lines. As discussed, the patterning of fin lines in bulk silicon may be performed by direct patterning using lithography techniques or by using spacers around mandrels that can achieve finer features than direct patterning. Regardless of which patterning technique is used, the operation 352 involves etching the pattern into silicon to form the fins. The resulting fin dimensions are highly dependent on feature density because of loading effects. FIG. 4A is a layout of fins that may be patterned in operation 352 according to some embodiments.

Figure 4B:
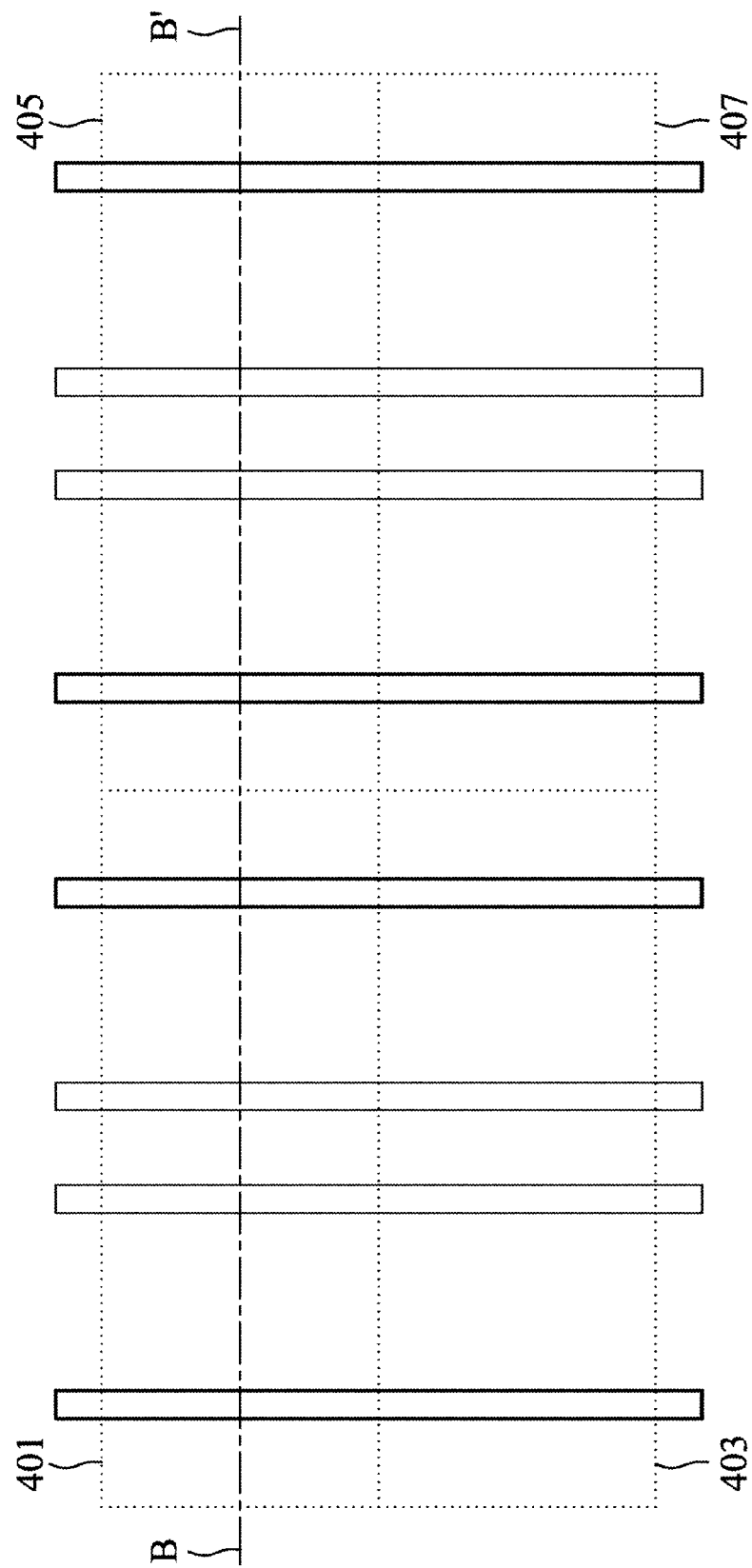

As is known to those skilled in the art, when cells are arranged together to form an array, the cell layouts may be flipped or rotated to enable higher packing densities. Often by flipping the cell over a cell boundary or axis and placing the flipped cell adjacent the original cell, common nodes and connections can be combined to increase packing density. FIGS. 4A and 4B are layouts of fins in an SRAM unit cell 400 each containing four SRAM cells 401, 403, 405, and 407 in accordance with various embodiments. The SRAM cells 401, 403, 405, and 407 are mirror images and in rotated images of each other. Specifically, the SRAM cells 401 and 405 are mirror images across the y-axis, as is SRAM cells 403 and 407. The SRAM cells 401 and 403 are mirror images across the x-axis, as is SRAM cells 405 and 407. Further, the diagonal SRAM cells (cells 401 and 407; cells 403 and 405) are rotated images of each other at 180 degrees.

As shown in FIG. 4A, each of the memory cells include four active fin lines 411, 413, 415, and 417, which corresponds to the fins 301, 303, 305, and 307 of the memory cell 300 of FIG. 3A. The fin lines in the mirror image cells are labeled according to their order in the memory cell 300. The unit cell 400 also includes dummy fin lines 421, 423, 425, 427, 429, 431, and 433. The dummy fin lines 421, 427, and 433 are edge dummy fin lines that may be shared between memory cells and unit cells. For example, edge dummy fin line 427 is shared by memory cells 401/403 and 405/407. Edge dummy fin lines 421 and 433 may be shared by different unit cells not shown. Dummy fin lines 423, 425, 429, and 431 are intra-cell dummy fin lines. They all have active fin lines on either side belonging to the same memory cell. In some embodiments, intra-cell dummy fin lines are not used.

Figure 5A:
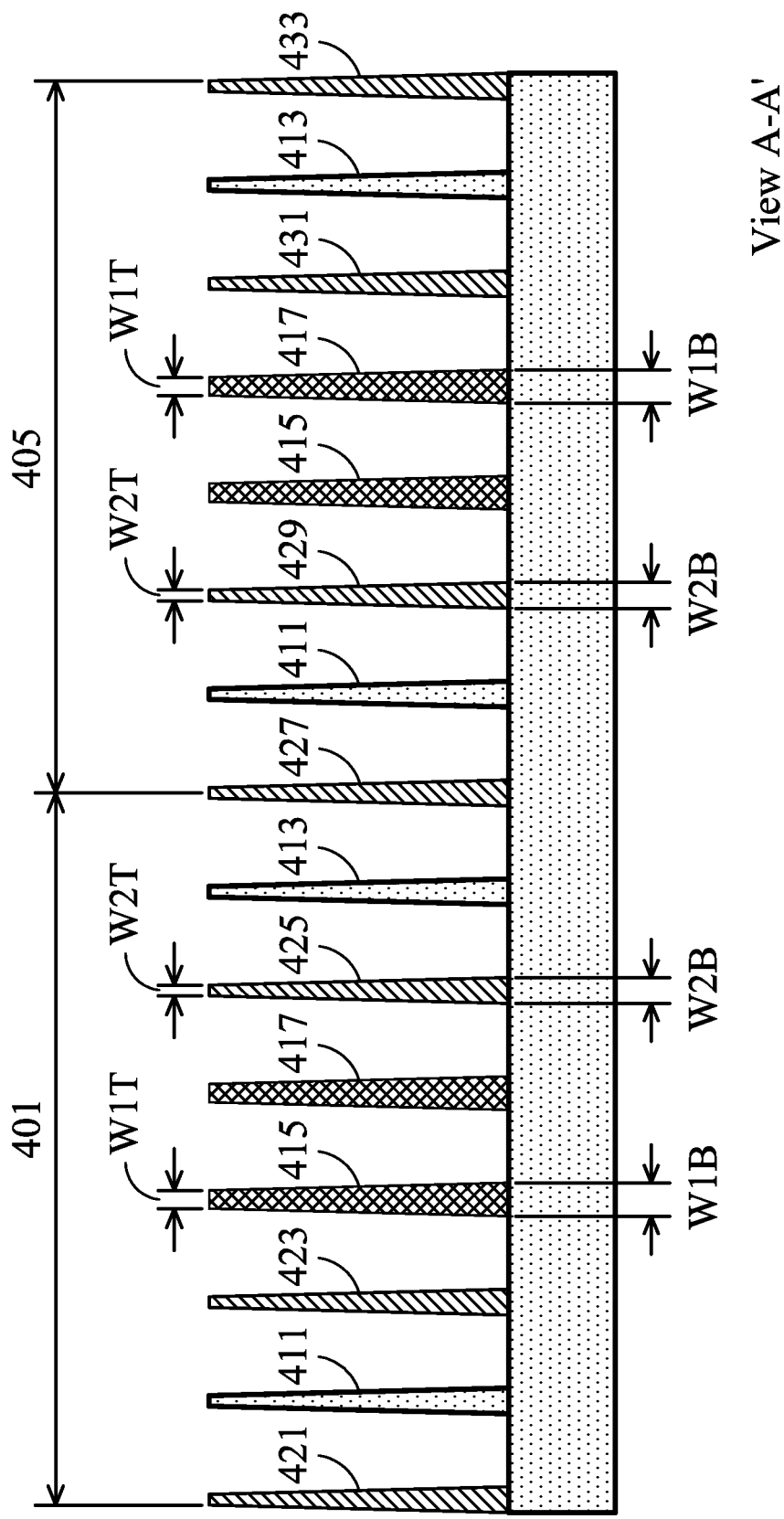
FIGS. 5A and 5B are a cross sectional diagram from cut lines A-A' of FIG. 4A and cut lines B-B' of FIG. 4B, respectively.

FIG. 5A is a cross sectional diagrams from cut lines A-A' of FIG. 4A across memory cells 401 and 405 after operation 352 of FIG. 3C. The various fins from FIG. 4A are labeled with the same element numbers in FIG. 5A. Because of the etch loading effects, the active fins 415 and 417 has a wider fin width overall than the active fins 411 and 413 and the dummy fins 421, 423, 425, and 427. The active fins 415 and 417 have a top width W1T at the top of the fin and a bottom width W1B at the bottom of the fin. The active fins 411 and 413 and the dummy fins 421, 423, 425, and 427 have a top width W2T at the top of the fin and a bottom width W2B at the bottom of the fin. Because these fins are formed by etching into bulk silicon, the fin widths at the bottom is always wider than the fin widths at the top. However, in dense areas the ratio of top fin width over bottom fin width is larger than the ratio in less dense areas. For example, W2T/W2B is larger than W1T/W1B. In other words, the fins 415 and 417 form less dense areas have a more gradual slope than the fins from dense areas.

Figure 5B:
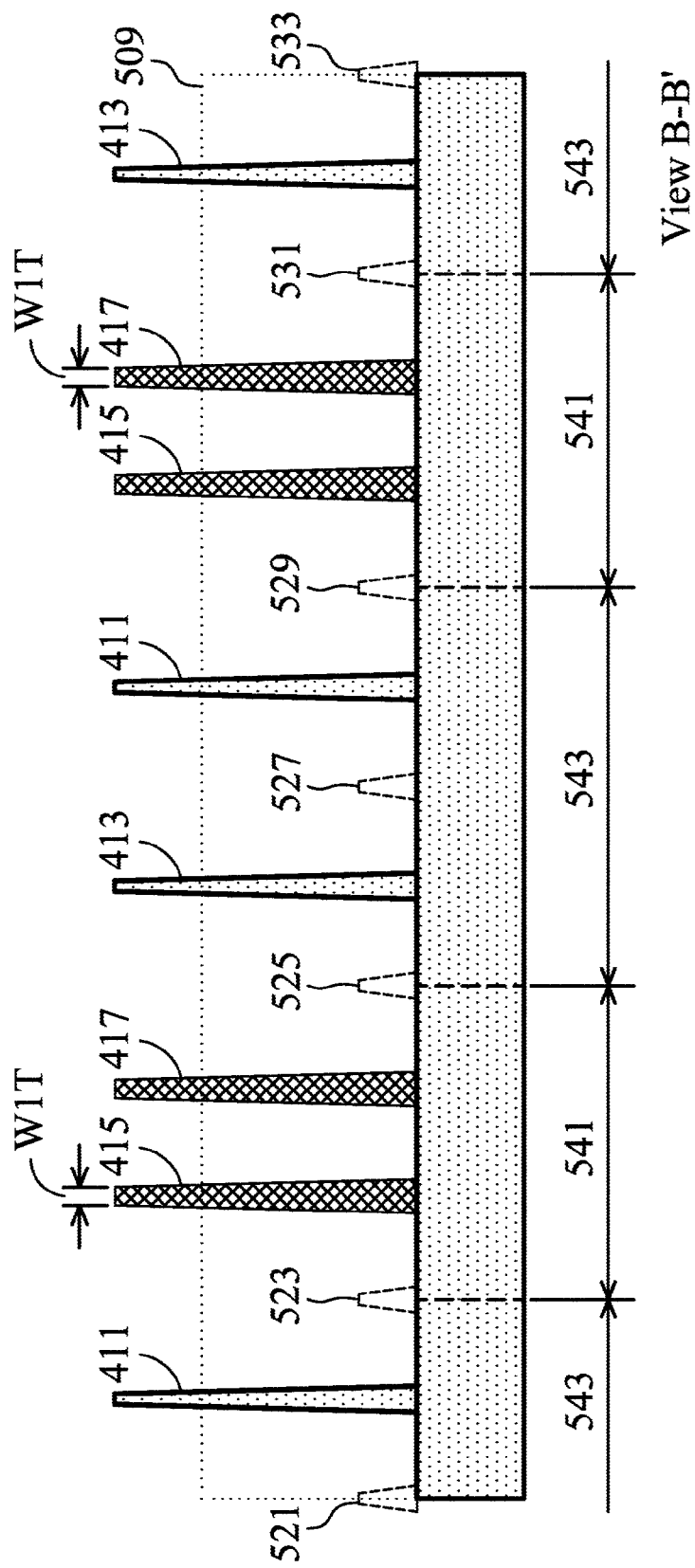

Referring back to FIG. 3C, in operation 354, at least a portion of the dummy fins is removed. The dummy fins are removed by patterning to expose only the dummy fins and then completely or partially removing the dummy fins by etching. Referring to FIG. 4B, FIG. 4B shows the fin layout after the dummy fins are removed from FIG. 4A, with only active fins remaining. The fin removal may be performed by a complete removal or a partial removal. In a complete removal, the dummy fins are etched while active fins are protected by a photoresist pattern. Wet etch or dry etch may be used. In a wet etch, the bulk silicon around the bottom of dummy patterns may experience some etching so that a small divot is formed. In a partial removal, a small portion of the dummy fins remain after the etch process. As shown in FIG. 5B according to cut lines B-B' of FIG. 4B, the small portions are stumps or fin tips 521, 523, 525, 527, 529, 531, and 533 that are subsequently buried under a shallow trench isolation (STI) layer 509 shown in dotted lines. The presence of the fin stumps may improve the uniformity of the STI deposition.

Referring back to method 350 of FIG. 3C, in operation 356 end cuts are patterned for some of the active fin lines. End cuts remove a portion of the fin. The remaining portions are segmented. The segmentation isolates some of the transistors from another and in some cases make space in the memory cells for other features. The end cuts are performed by protecting portions of the fins to be kept in a photomask or patterned hardmask. The exposed fin portions are removed in an etch process. Operation 356 may be preceded by operation 352 or operation 354. In other words, the end cuts may be performed before or after the dummy fin removal. In some cases, the end cuts may be performed at the same time as the dummy fin removal.

Figure 6A:
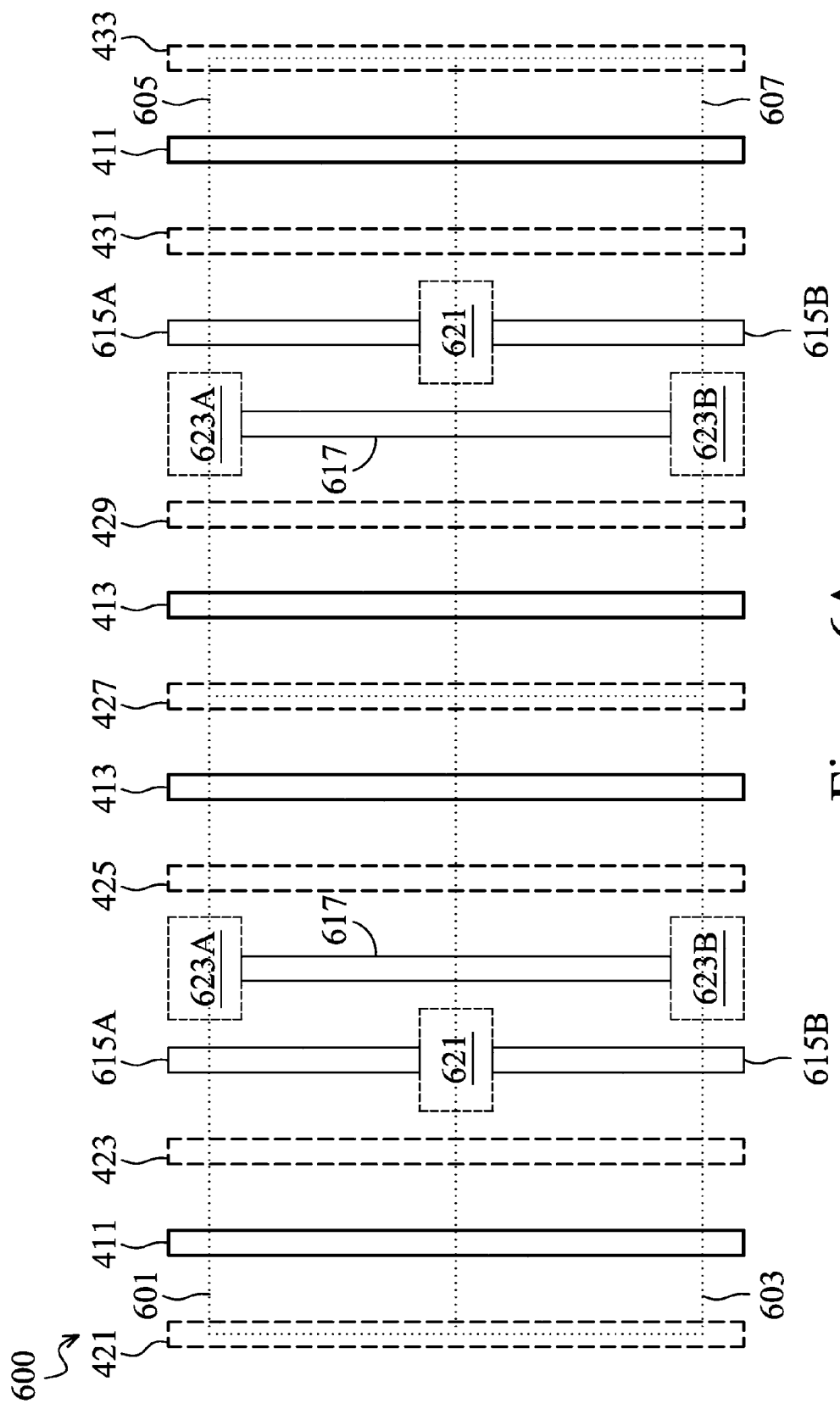
FIGS. 6A through 6C illustrate resulting layout views when end cuts are performed for different embodiments.
Figure 6B:
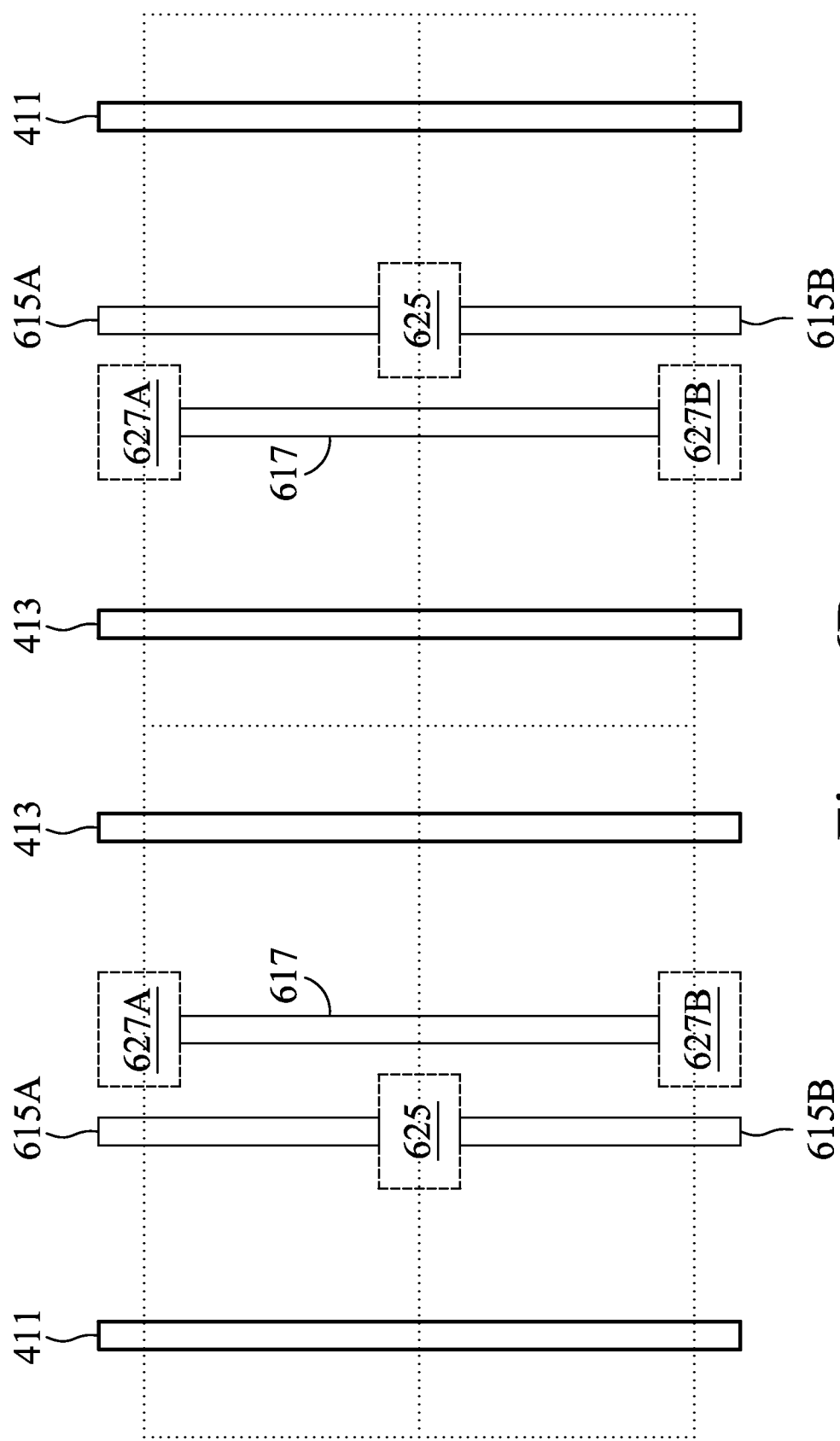

FIG. 6A shows a resulting layout when the end cuts are performed before the dummy fin removal. The active fins 415 and 417 are cut into fins 615A/615B and 617 by removing end portions 623A and 623B from the unit cell 400 of active fin line 417 to form active fin 617 and a middle portion 621 of active fin line 415 to form active fins 615A and 615B with the dummy fins still in the layout. FIG. 6B shows a resulting layout when the end cuts are performed after the dummy fin removal. Without dummy fins in place, the patterning and etching of the end cuts have a larger process window. In FIG. 6B, the active fins 415 and 417 are cut into fins 615A/615B and 617 by removing end portions 627A and 627B from the unit cell 400 of active fin line 417 to form active fin 617 and a middle portion 625 of active fin line 415 to form active fins 615A and 615B. The fin cut portions 625 and 627A/B of FIG. 6B are larger and therefore are easier to define than the fin cut portions 621 and 623A/B of FIG. 6A. According to various embodiments, the end cuts may also include end portions from fins between unit cells that are not shown in FIG. 6A or 6B.

Figure 6C:
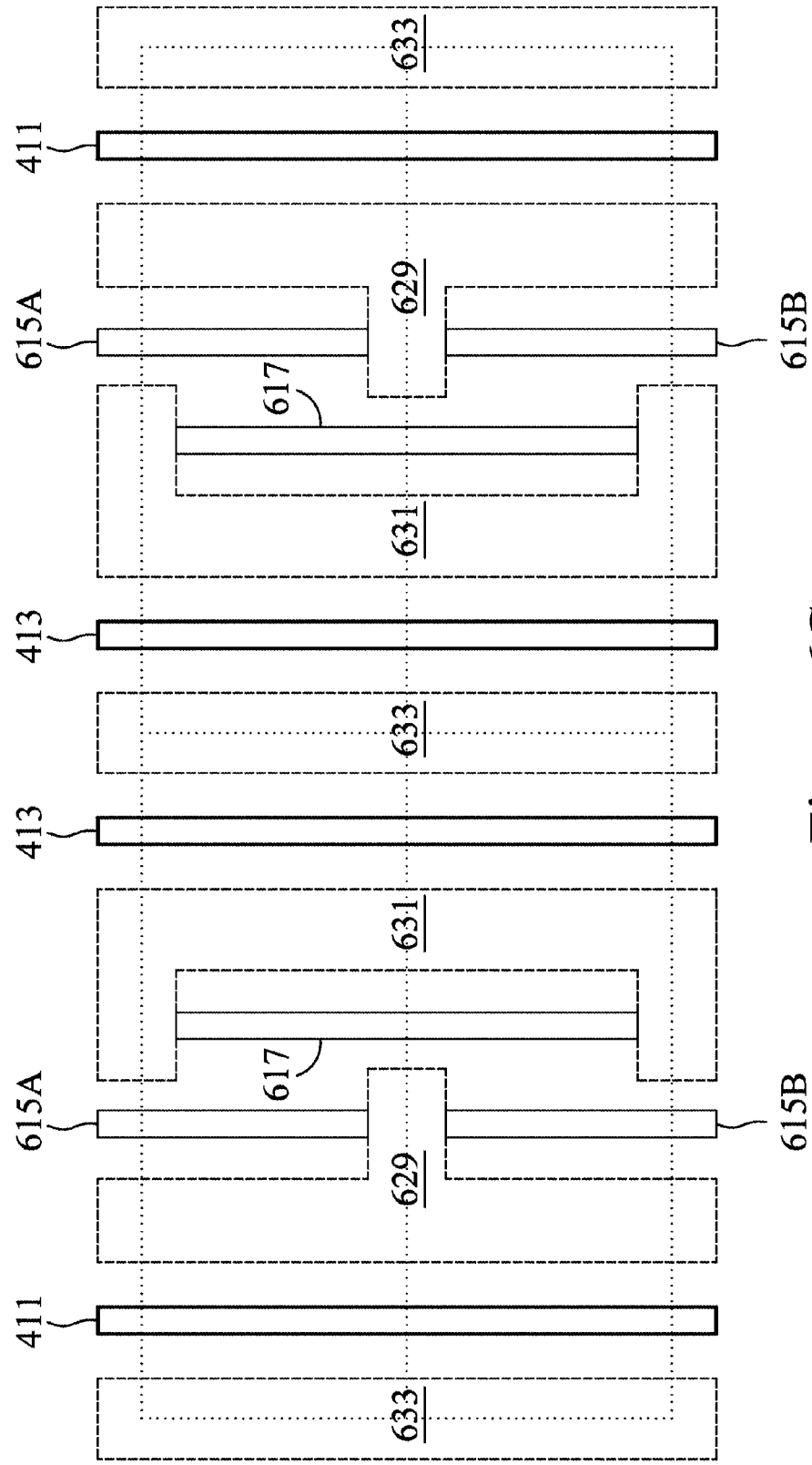

In some embodiments, the dummy fin removal of operation 354 and the end cuts of operation 356 are performed together using one patterning and etch process. A photomask containing patterns for both the dummy lines and the end cuts are used to protect portions of the fin lines to be kept. Exposed portions of both dummy fin lines and end cuts are then etched at the same time. FIG. 6C shows these embodiments. The fin cut between fins 615A and 615B is formed with pattern 629 that also included a dummy fin removal. The fin cut on either sides of is fin 617 is formed with pattern 631 that also included a dummy fin removal. Some patterns such as pattern 633 only include dummy fin removal. The patterns 629 and 631 are complex shapes and are more difficult to generate using one photo pattern when the fins are close together.

Referring back to FIG. 3C, in operation 358 a shallow trench isolation (STI) layer is deposited over and in between the remaining fins. The STI material may be any commonly used dielectric material for this purpose and includes various silicon oxides formed using CVD processes. The STI layer buries any remaining portions of dummy fins that fully removed in operation 354 and covers all remaining active fins. Then in operation 360, the STI is recessed to expose sidewalls of the fins. FIG. 2 shows a FinFET having recessed STI 205 exposing sidewalls of top portion 207 of fins 203. The STI layer may be planarized first, then etched to expose portion 207 having at a height. The unexposed portion 209 has a height defined as the STI depth. FIG. 5B shows a cross section of fins 411, 415, 417, and 413 having recessed STI 509 which completely covers partially removed dummy fins 521, 523, 525, 527, 529, 531, and 533.

Referring back to FIG. 3C, the fins are implanted with dopants to form p-wells and n-wells in operation 362 using known processes. P-wells are formed for n-type FinFETs. N-wells are formed for p-type FinFETs. FIG. 5B shows the n-well region 541 and p-well region 543. The p-well region 543 straddles two memory cells 401 and 405. A gate dielectric is deposited in operation 364. Referring to FIG. 2, the gate dielectric 213 conformally coats the exposed portion of the fins. The gate dielectric 213 may be a thermal silicon oxide or a high k metal oxide. The gate dielectric 213 may include more than one material and is usually deposited using a CVD process. A gate material is then deposited over the gate dielectric in operation 366 of FIG. 3C. The gate material may be a polysilicon or some other conductive material such as metals or layer of metals. The gate dielectric layer and the gate material is then patterned to form a gate structure including a gate dielectric 213 and gate 211 as shown in FIG. 2. Gate cuts may be performed in this operation or in a subsequent operation to partition the gates in the memory cell. In operation 368 of FIG. 3C, a source region and a drain region is formed at ends of the fins to complete the FinFET. Note that for some high k metal gate FinFETs, a polysilicon gate is formed first but subsequently removed and replaced with a metal structure.

Figure 7:
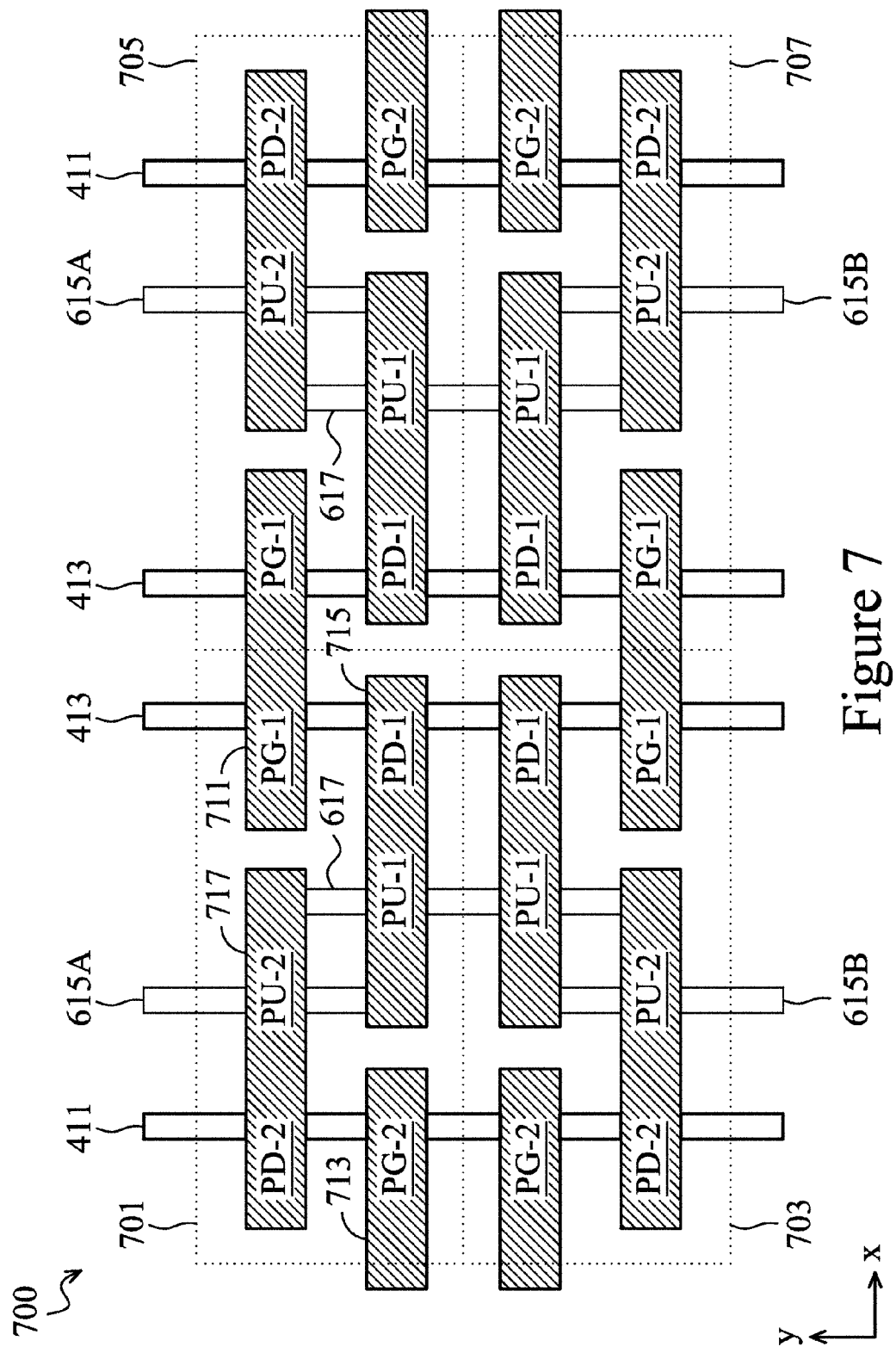
FIG. 7 is a layout of an exemplary unit cell having four memory cells having 6 FinFETs per memory cell fabricated in accordance with embodiments of the present disclosure.

FIG. 7 is a layout of the unit cell 700 having four memory cells 701, 703, 705, and 707 having 6 FinFETs per memory cell fabricated in accordance with various embodiments of the present disclosure as discussed in association with FIG. 3C. Each memory cell includes is four gate regions. The gate regions extend parallel in the x-direction along the length of the SRAM cell. Four fins are orthogonal to the gate regions in the layout diagram. A transistor is formed at a cross point of a fin and a gate region. The six transistors of the SRAM cell are formed at different cross points. For example in memory cell 701, the first pass-gate transistor PG-1 is formed at the cross point of the fin 413 and the gate region 711. The second pass-gate transistor PG-2 is formed at the cross point of the fin 411 and the gate region 713. The first pull-down transistor PD-1 is formed at the cross point of the fin 413 and the gate region 715. The second pull-down transistor PD-2 is formed at the cross point of the fin 411 and the gate region 717. The first pull-up transistor PU-1 is formed at the cross point of the fin 617 and the gate region 715. The second pull-up transistor PU-2 is formed at the cross point of the fin 615A and the gate region 717. Each of the gate regions 711, 713, 715, and 717 forms two transistors. Each of the fins 617 and 615A/B formed over the n-well forms one transistor per memory cell and a total of two transistors in a unit cell. Note that the fins 615A/B may connect across different unit cells. The fins 411 and 413 formed over the p-wells form two transistor in each memory cell and four transistors in a unit cell. In other words, a single gate region is used as the gates of transistors PD-1 and PU-1. Another single gate region is used as the gates of transistors PD-2 and PU-2. In this manner, each single gate region electrically couples the gates of the respective two transistors.

Various contacts and their corresponding interconnect vias may be employed to couple components in the SRAM unit cell 700. Through a via and a gate contact, a word line contact WL may be coupled to the gate of pass-gate transistor PG-1, and another word line contact WL is coupled to the gate of pass-gate transistor PG-2. Likewise, a bit line contact BL is coupled to the drain of pass-gate transistor PG-1, and a complementary bit line contact BLB is coupled to the drain of pass-gate transistor PG-2.

A power source contact VCC is coupled to the source of the pull-up transistor PU-1, and another power source contact VCC is coupled to the source of the pull-up transistor PU-2. A ground contact VSS is coupled to the source of the pull-down transistor PD-1, and another ground contact VSS is coupled to the source of the pull-down transistor PD-2. A storage node contact SN couples together the source of transistor PG-1 and the drains of transistors PD-1 and PU-1. Another storage node contact SNB couples together the source of transistor PG-2, and the drains of transistors PD-2 and PU-2.

The SRAM cell 703 is a duplicate cell but flipped over the X axis at the top of the SRAM cell 701. The common features BL, VCC, and VSS, are combined to save space. Thus the two cells pack into a space that is less than twice the cell boundary area. The N-wells are combined and extend in the Y direction, as do the P-wells. A first drain/source region of PU-1 is coupled to VCC through a contact. A second drain/source region of PU-1 is coupled to the storage node SN.

Figure 8A:
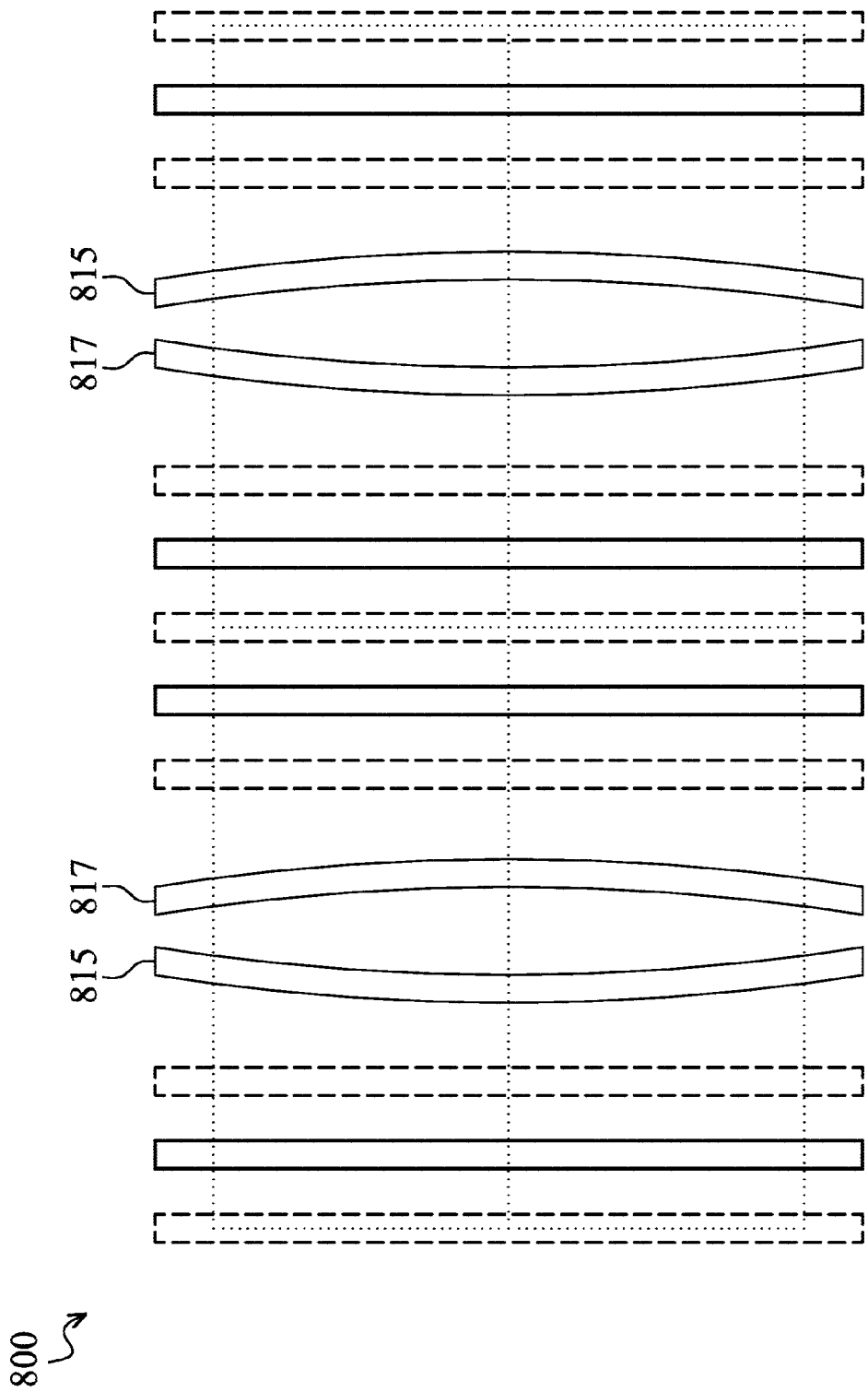
FIGS. 8A through 8C are layout views of various embodiments having curved fins.
Figure 8B:
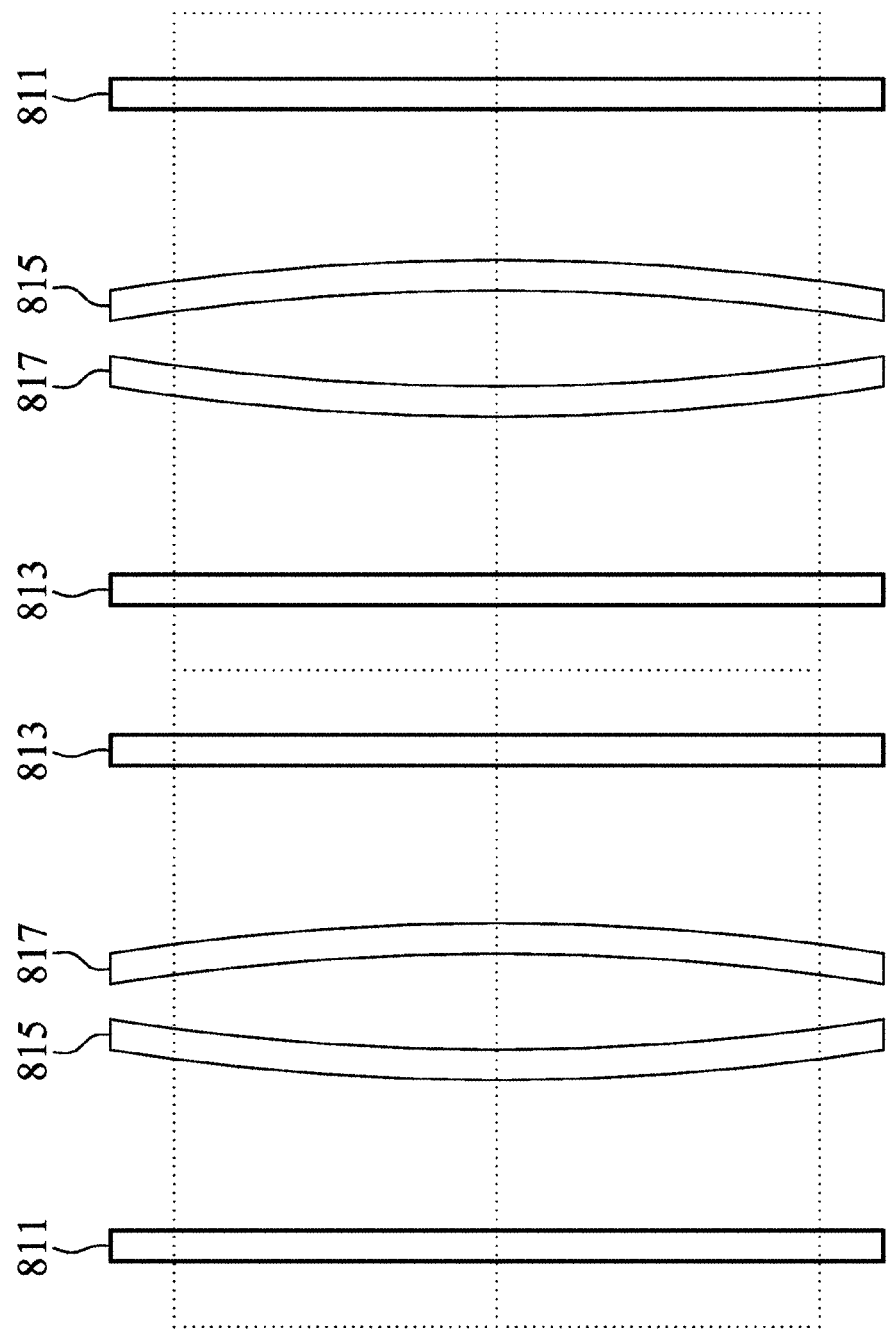
Figure 8C:
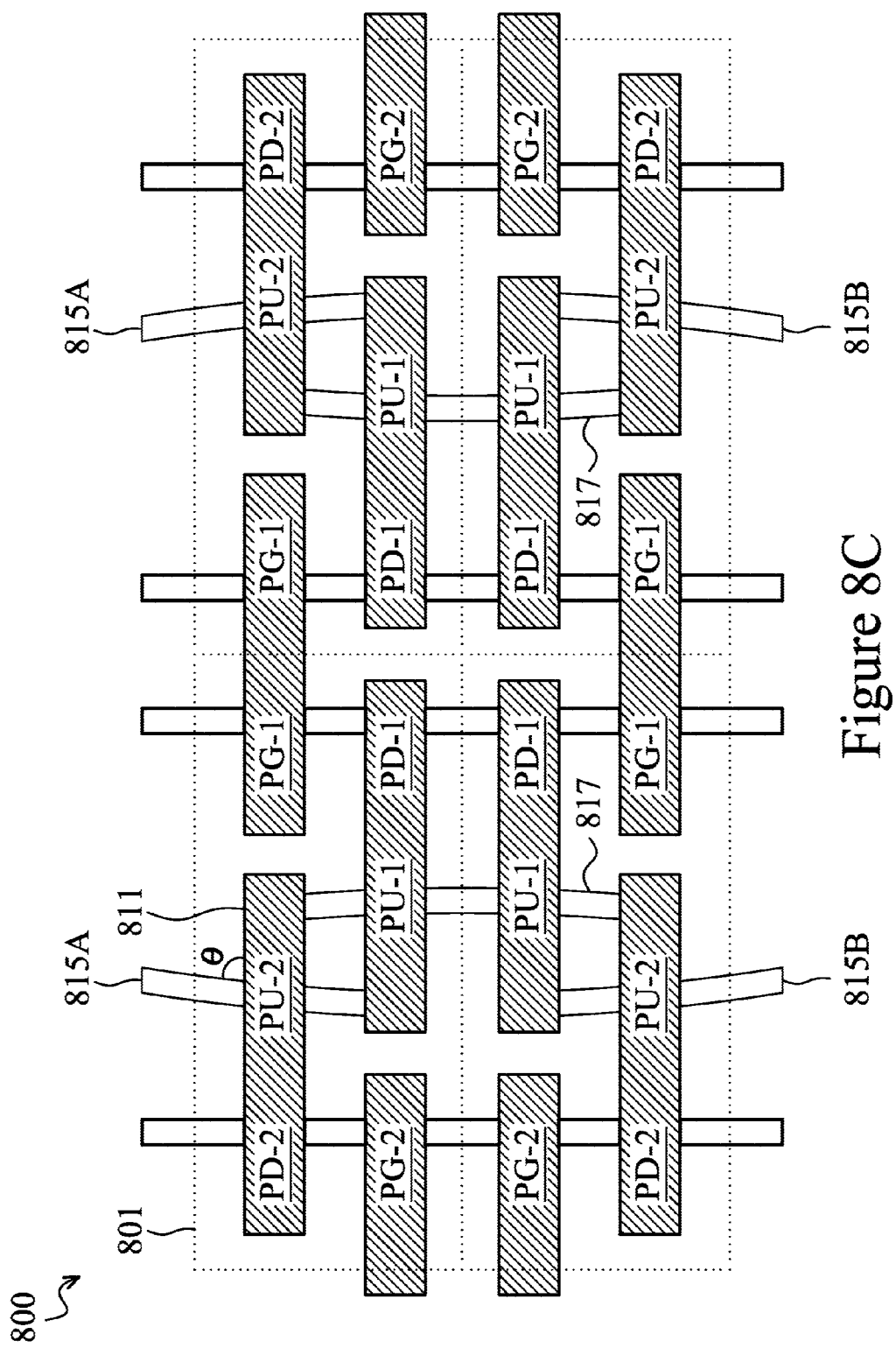

According to some embodiments, the active fins for the pull-up transistors PU-1 and PU2 are not straight. As shown in layout diagrams FIGS. 8A, 8B and 8C showing unit cell 800, which corresponds to unit cell 400 of FIGS. 4A and 4B, active fins 815 and 817 are curved. As shown, active fins 815 and 817 are curved towards each other. In some embodiments, the active fins 815 and 817 may curve away from each other or in the same direction. Additionally, the fins 815 and 817 may have an "S" shape across several memory cells. FIG. 8A shows a pattern including all of the fin lines. FIG. 8B shows a fin layout pattern after the dummy fin lines have been removed, leaving only the active fin lines 811, 813, 815, and 817. FIG. 8C shows a layout pattern including the active fin lines and gate regions, corresponding to unit cell 700 of FIG. 7 without curved fin lines 815A/B and 817. An acute angle θ (theta) is shown between the curved fin 815A and gate region 811 in memory cell 801. According to various embodiments, a minimum value of the acute angle θ is about 35 degrees. In other words, the angle may be greater than about 35 degrees up to 90 degrees. In some embodiments, the angle may be between about 35 degrees and 75 degrees. The angle may be formed between the fins 811 and 815A/B and any of the gate regions.

Figure 9A:
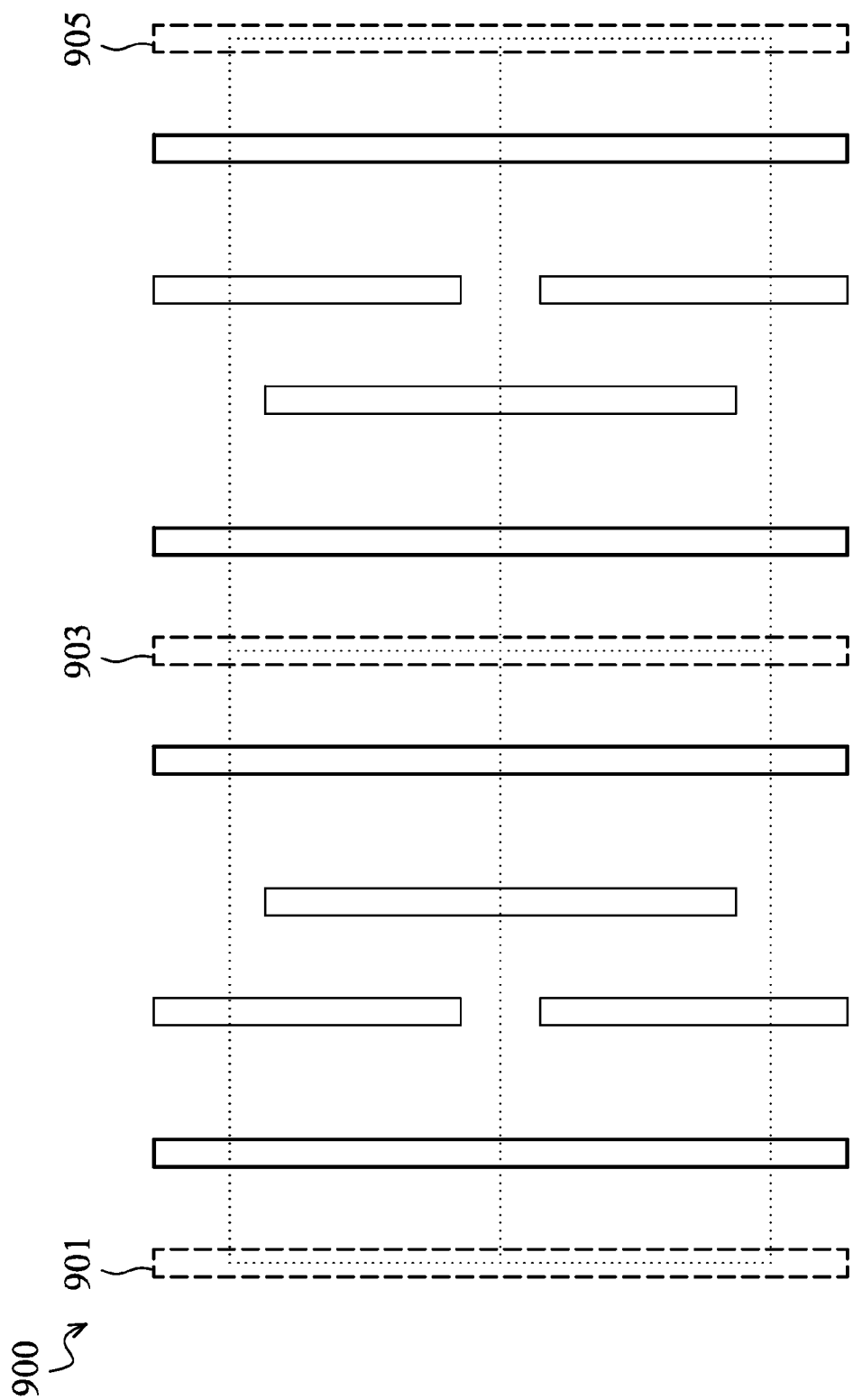
FIG. 9A is a layout diagram showing dummy fins in an illustrative unit cell where dummy fins are utilized only between edge fins at memory cell boundaries.
Figure 9B:
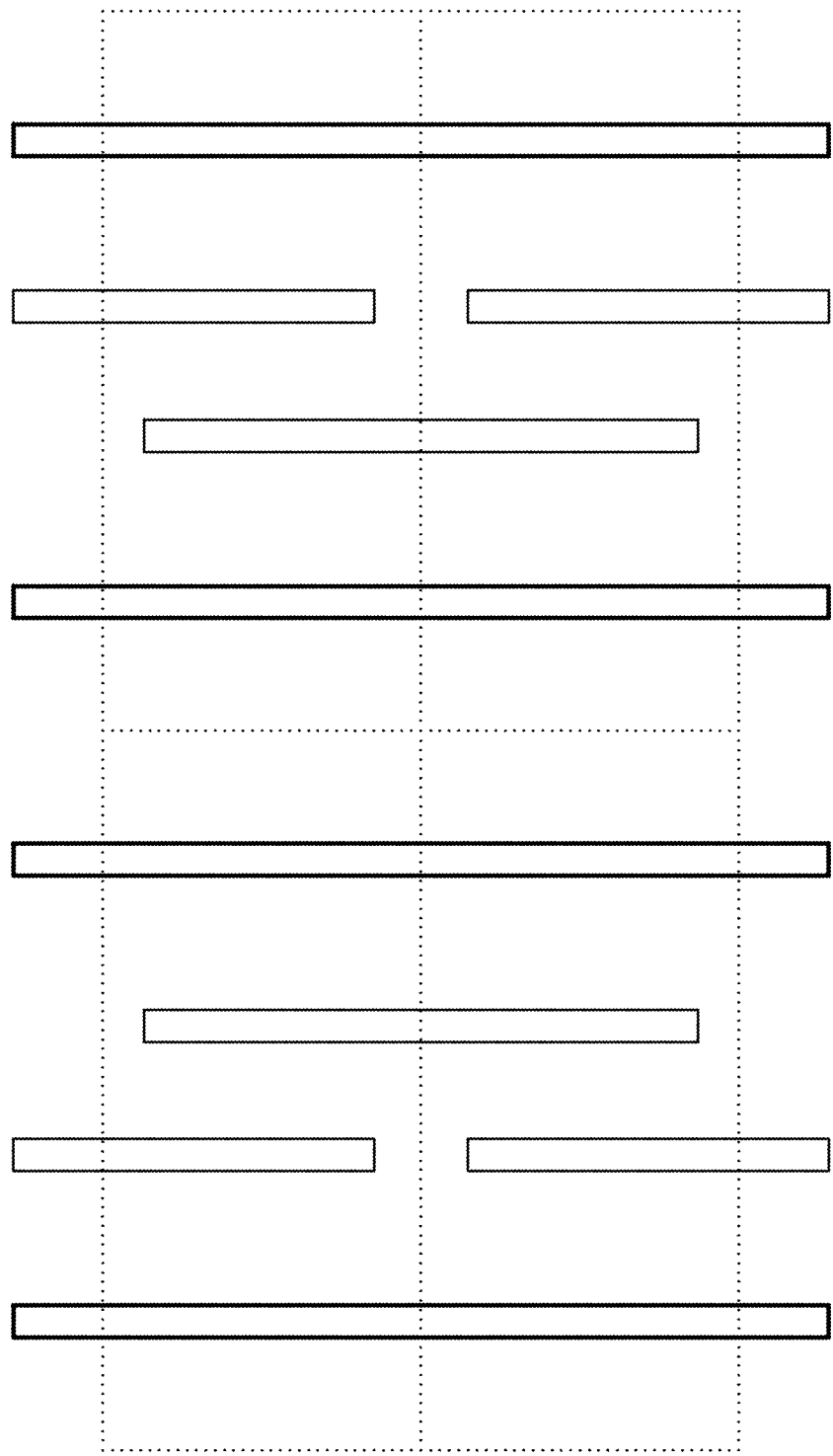
FIG. 9B shows the layout after the dummy fins are removed.

According to various embodiments, the dummy fins between the PD and PU transistors may be omitted. FIG. 9A is a layout diagram showing dummy fins 901, 903, and 905 in unit cell 900. In these embodiments, the dummy fins are utilized only between edge fins at memory cell boundaries. FIG. 9B shows the layout after the dummy fins are removed.

Figure 10A:
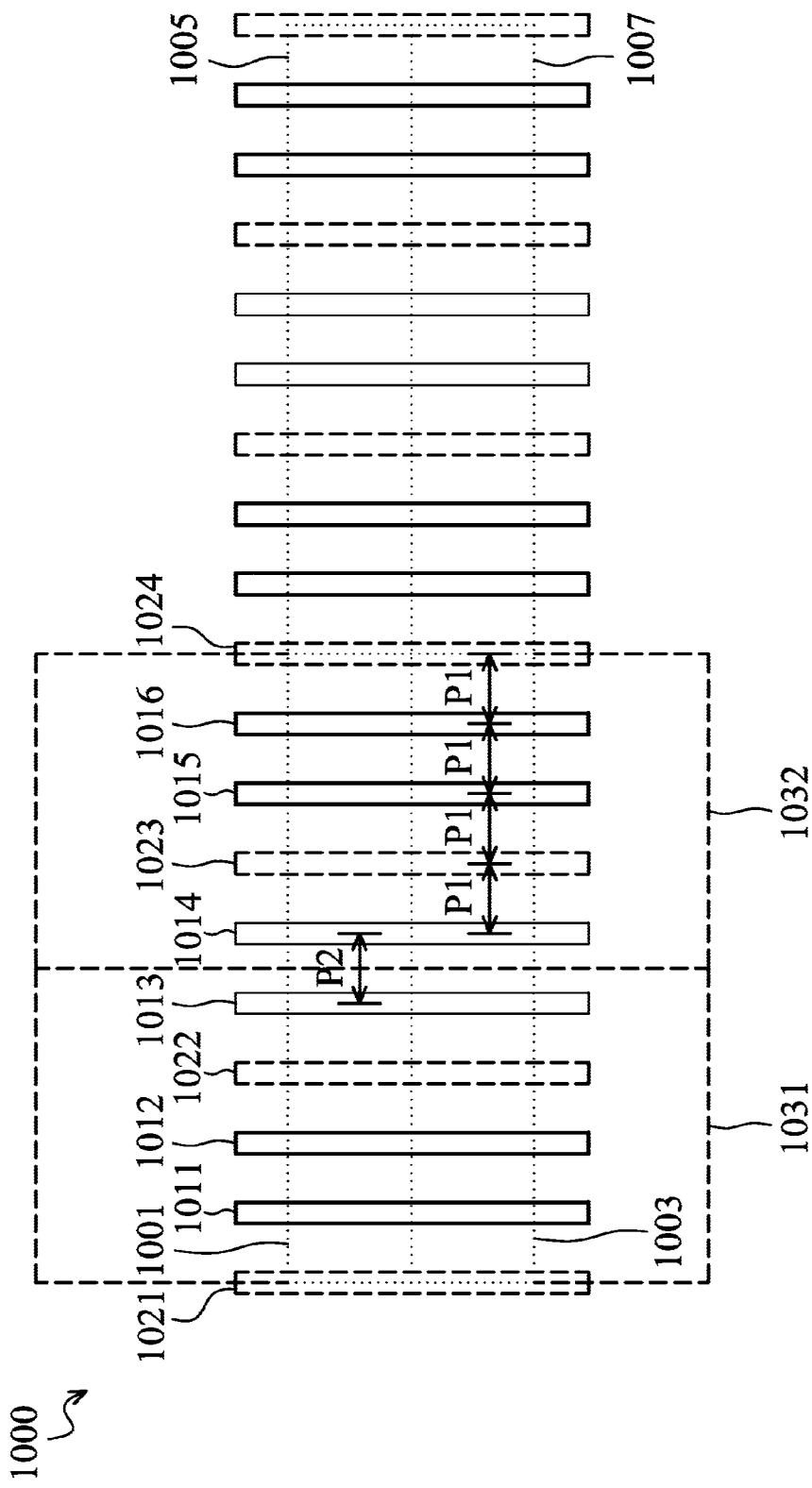
FIG. 10A is a layout diagram showing a fin line pattern with pull-down and pass-gate transistors each having two fins.

According to some embodiments, the pull-down and pass-gate transistors may include more than one fin. FIG. 10A is a layout diagram showing the fin line pattern with the pull-down and pass-gate transistors each having two fins. Memory unit cell 1000 includes four memory cells 1001, 1003, 1005, and 1007. Memory cell 1001 includes six active fins lines 1011, 1012, 1013, 1014, 1015, and 1016 and dummy fin lines 1021, 1022, 1023, and 1024. The fins are divided into two groups 1031 and 1032 shown in dotted lines. The fin line groups 1031 and 1032 and mirror images of each other and each contain five fin lines. Fin pitch within each fin line group is same, having a pitch P1 in group 1032 as shown in FIG. 10A. The fin pitch between edge fins 1013 and 1014 across the two fin line groups is P2. P2 is greater than P1. The corollary is that the distance between two nearest fins (1013 and 1014) between the two groups (1031 and 1032) is greater than the distance between two adjacent fins, for example, 1023 and 1015, in the same group 1032. Note that a measurement of pitch usually initiated from a fin center to a fin center, thus is greater than a distance between fins by a fin width. When a fin is wider or narrower and the distance between them is the same, the pitch is necessarily greater or lesser. The concept of each memory cell having two groups of fins lines for discussion of fin spacing may be applied to memory cells where all transistors have one fin, such as that of memory cells in unit cell 700 of FIG. 7. For memory cells in unit cell 700, each of the groups include four fin lines of two active fin lines and two dummy fin lines.

Figure 10B:
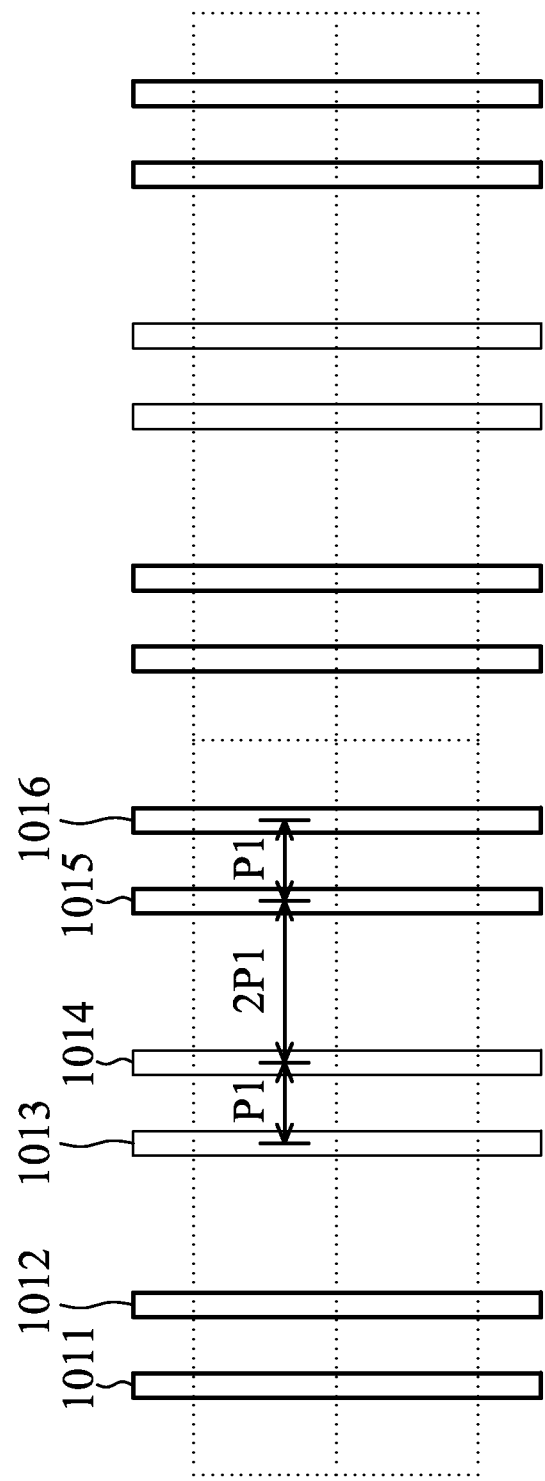
FIG. 10B shows the fin layout after the dummy fins have been removed.
Figure 10C:
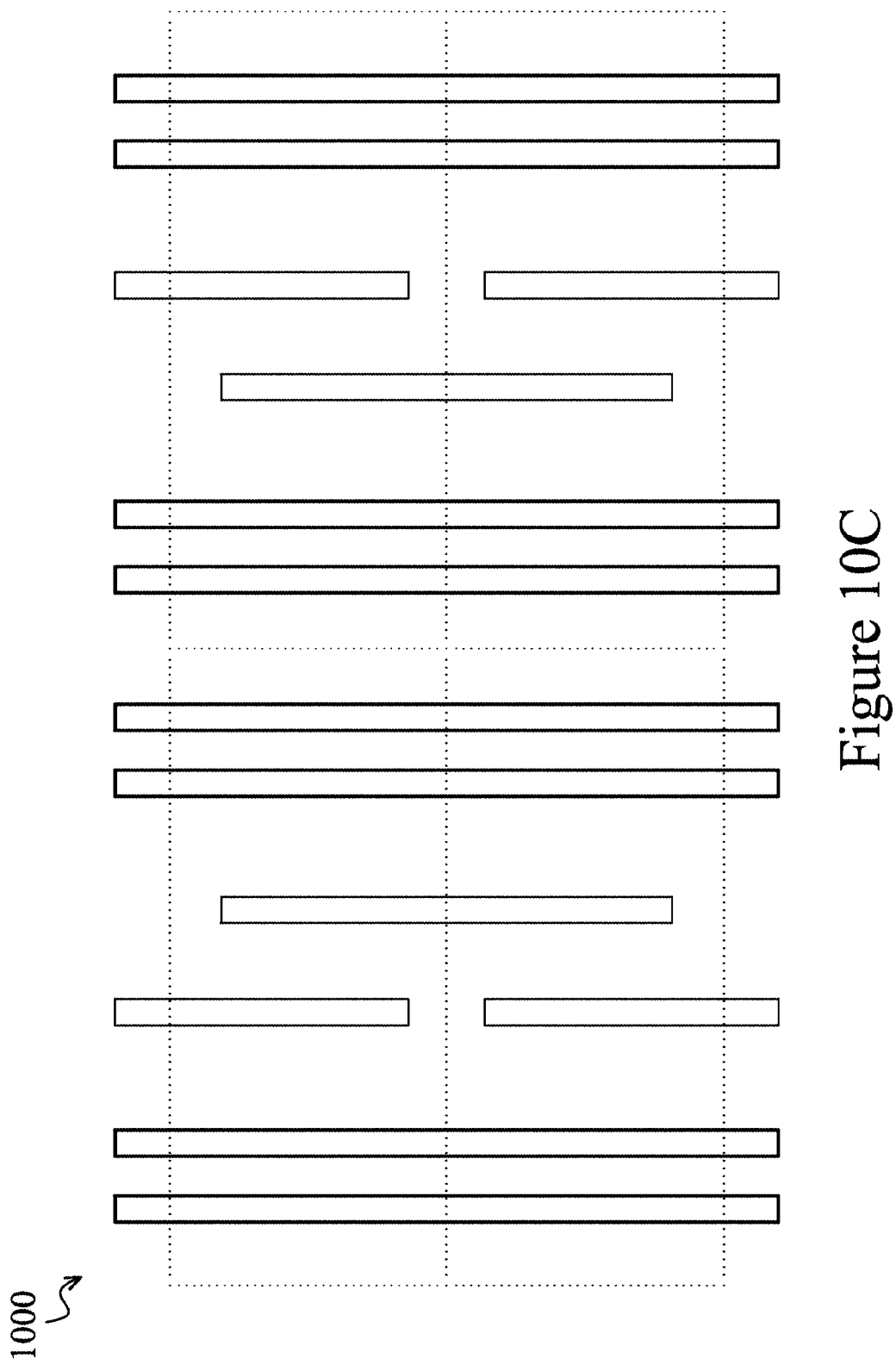
FIG. 10C shows the unit cell after the end cuts.
Figure 10D:
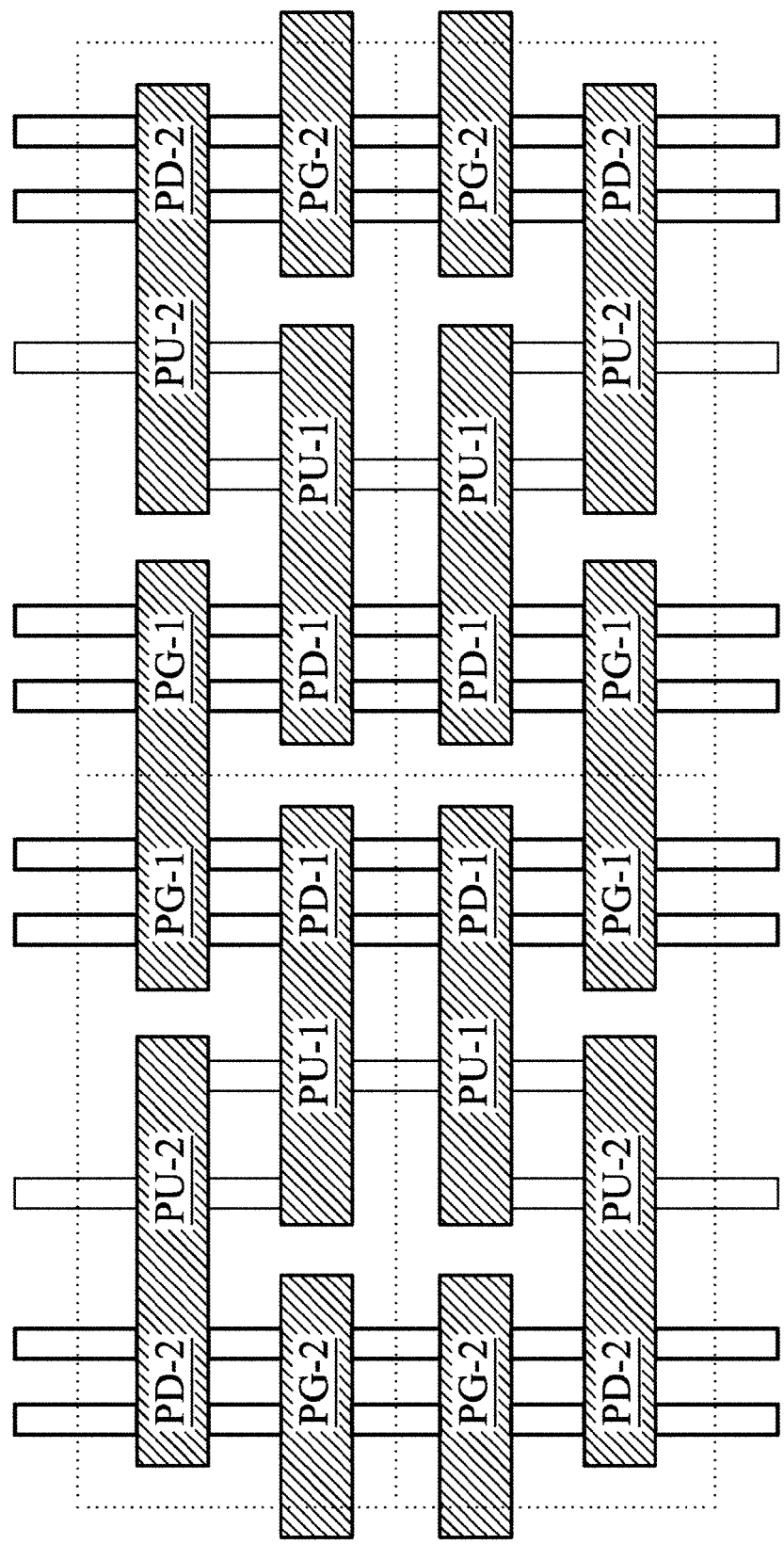
FIG. 10D shows the fin layout of FIG. 10C with the gate regions.

FIG. 10B shows the fin layout after the dummy fins have been removed, leaving fins 1011, 1012, 1013, 1014, 1015, and 1016 behind. The pitch between fin lines 1013 and 1014 remains P2 and between fin lines 1015 and 1016, P1. Without an interspersed dummy fin, the pitch between active fin lines 1014 and 1015 is two times P1. Two times P1 is greater than P2. FIG. 10C shows the unit cell 1000 after the end cuts. The difference between FIG. 10C and FIG. 6B is having an extra active fin line for the pull-down and pass-gate transistors. FIG. 10D shows the fin layout of FIG. 10C with the gate regions. Each of PG-1, PG-2, PD-1 and PD-2 has two fins per transistor while the PU-1 and PU-2 each has one fin per transistor. Other SRAM cell designs may include even more fins per transistor than the embodiments of FIGS. 10A to 10D. For example, the PU transistors may have two fins each with the PG and PD transistors each have three fins. In another example, the PU transistors have one fin each and the PG and PD transistors each have three fins.

According to various embodiments, one aspect of the present disclosure pertains to a method of forming a semiconductor device having a static random-access memory (SRAM) cell array, wherein each SRAM cell comprises two pull-up (PU), two pass-gate (PG), and two pull-down (PD) FinFETs. The method includes patterning a plurality of fins including active fins and dummy fins and patterning and removing at least a portion of the dummy fins. Each PG FinFET shares at least one active fin with a PD FinFET. No dummy fin is disposed between PU FinFETs in a memory cell, and a dummy fin is disposed between a PU FinFET and the at least one active fin shared by a PG and a PD FinFET. At least one dummy fin is disposed between the at least one active fin shared by a PG and PD FinFET across adjacent memory cells.

Another aspect of the present disclosure pertains to a method of forming a static random-access memory (SRAM) cell array having a plurality of SRAM cells. The method includes patterning two groups of at least four fins in each cell area and removing, at least partially, two fins from each group of at least four fins. Each group having parallel fins and the groups of fins are aligned horizontally. Each group includes a PU transistor, a PG transistor, and a PD transistor. Each PG transistor shares at least one active fin with a PD transistor. A distance between two nearest fins between the two groups is greater than a distance between two adjacent fins in a group. The two fins removed are one from an outer edge of the cell area and a second fin from the center of the cell area.

In yet another aspect, the present disclosure pertains to an SRAM cell array having a number of SRAM cells. Each SRAM cell includes six FinFETs including two pull-up (PU) transistors, two pass-gate (PG) transistors, and two pull-down (PD) transistors. The PU transistors are adjacent to each other and include one active fin having a first fin width. Each PG transistor shares at least one active fin with a PD transistor. The at least one active fin shared by a PG and a PD transistor has a second fin width smaller than the first fin width.

In yet still another aspect, an SRAM cell is provided. The SRAM cell includes a plurality of SRAM cells, each SRAM cell including six FinFETs including two pull-up (PU) transistors, two pass-gate (PG) transistors, and two pull-down (PD) transistors. Each PU transistor includes one active fin having a first fin width, the one active fin of each PU transistor being adjacent to each other. Each PG transistor shares at least one active fin with a PD transistor, and the at least one active fin shared by a PG and a PD transistor has a second fin width smaller than the first fin width.

In yet still another aspect, an SRAM cell is provided. The SRAM cell includes a first fin electrically coupled as a source/drain of a first pass-gate transistor and a source/drain of a first pull-down transistor, a second fin electrically coupled as a source/drain of a first pull-up transistor, a third fin electrically coupled as a source/drain of a second pull-up transistor, and a fourth fin electrically coupled as a source/drain of a second pass-gate transistor and a source/drain of a second pull-down transistor. The second fin and the third fin are interposed between the first fin and the fourth fin, and a first distance between the first fin and a closest fin of the second fin and the third fin is greater than a second distance between the second fin and the third fin.

In yet still another aspect, an SRAM cell is provided. The SRAM cell includes a first pass-gate transistor and a first pull-down transistor sharing a first fin, a first pull-up transistor including a second fin, and a second pull-up transistor including a third fin. A second pass-gate transistor and a second pull-down transistor share a fourth fin. The second fin and the third fin are interposed between the first fin and the fourth fin. The first fin has a first ratio of a first fin top width to a first fin bottom width, the second fin has a second ratio of a second fin top width to a second fin bottom width, wherein the first ratio is greater than the second ratio.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An SRAM cell array comprising:
a plurality of SRAM cells, each SRAM cell comprising six FinFETs including two pull-up (PU) transistors, two pass-gate (PG) transistors, and two pull-down (PD) transistors;
wherein each PU transistor includes one active fin having a first fin width, the one active fin of each PU transistor being adjacent to each other;
wherein each PG transistor shares at least one active fin with a PD transistor;
wherein the at least one active fin shared by a PG transistor and a PD transistor has a second fin width smaller than the first fin width; and
wherein no dummy fin is disposed between the one active fin of each PU transistor in a memory cell, a dummy fin is disposed between a PU transistor and the at least one active fin shared by a PG transistor and the PD transistor, and at least one dummy fin is disposed between the at least one active fin shared by the PG transistor and PD transistor in the memory cell and a fin shared by a PG transistor and a PD transistor in an adjacent memory cells.

2. The SRAM cell array of claim 1, wherein a ratio of second fin width over the first fin width is between about 0.6 and about 0.9.

3. The SRAM cell array of claim 1, wherein a distance between active fins of the adjacent PU transistors is smaller than a distance between an active fin of a PU transistor and an active fin of a nearest PG or PD transistor.

4. The SRAM cell array of claim 1, further comprising shortened dummy fins embedded in a shallow trench isolation (STI) layer below gates of the FinFETs.

5. The SRAM cell array of claim 4, wherein the shortened dummy fins are disposed between the PU transistor and the at least one active fin shared by a PG and a PD transistor and between adjacent memory cells.

6. The SRAM cell array of claim 1, wherein the PG and PD transistors include more than one active fin.

7. The SRAM cell array of claim 1, wherein PU transistor active fins are curved.

8. The SRAM cell array of claim 7, wherein a minimum angle between a gate electrode and the PU transistor active fins is 35 degrees.

9. An SRAM cell array, each cell comprising:
a first fin electrically coupled as a source/drain of a first pass-gate transistor and a source/drain of a first pull-down transistor;
a second fin electrically coupled as a source/drain of a first pull-up transistor;
a third fin electrically coupled as a source/drain of a second pull-up transistor; and
a fourth fin electrically coupled as a source/drain of a second pass-gate transistor and a source/drain of a second pull-down transistor;
wherein the second fin and the third fin are interposed between the first fin and the fourth fin; and
wherein a first distance between the first fin and a closest fin of the second fin and the third fin is greater than a second distance between the second fin and the third fin.

10. The SRAM cell array of claim 9, further comprising one or more dummy fins, the one or more dummy fins having a fin height less than a fin height of the first fin, the second fin, the third fin, and the fourth fin.

11. The SRAM cell array of claim 10, wherein a first dummy fin is interposed between the first fin and a closest fin of the second fin and the third fin, and wherein a second dummy fin is interposed between the fourth fin and a closest fin of the second fin and the third fin.

12. The SRAM cell array of claim 9, wherein a fin width of second fin and the third fin is greater than a fin width of the first fin and the fourth fin.

13. The SRAM cell array of claim 9, wherein at least one of the second fin and the third fin are curved.

14. The SRAM cell array of claim 9, wherein the first fin comprises a plurality of fins.

15. The SRAM cell array of claim 14, wherein the fourth fin comprises a plurality of fins.

16. An SRAM cell array, each cell comprising:
a first pass-gate transistor and a first pull-down transistor sharing a first fin;
a first pull-up transistor including a second fin;
a second pull-up transistor including a third fin; and
a second pass-gate transistor and a second pull-down transistor sharing a fourth fin;
wherein the second fin and the third fin are interposed between the first fin and the fourth fin;
wherein the first fin has a first ratio of a first fin top width to a first fin bottom width;
wherein the second fin has a second ratio of a second fin top width to a second fin bottom width; and
wherein the first ratio is greater than the second ratio.

17. The SRAM cell array of claim 16, wherein a distance between the first fin and an adjacent fin of the second fin and the third fin is greater than a distance between the second fin and the third fin.

18. The SRAM cell array of claim 16, wherein the first fin comprises a plurality of fins.

19. The SRAM cell array of claim 16, wherein a distance between the first fin of a first cell and the first fin of a second cell is less than a distance between the second fin and the third fin of a same cell.

20. The SRAM cell array of claim 16, wherein one or more of the second fin and the third fin are curved.

* * * * *